(12) United States Patent
Park et al.

(10) Patent No.: US 9,496,594 B2
(45) Date of Patent: Nov. 15, 2016

(54) PRINTED CIRCUIT BOARD AND PRINTED CIRCUIT BOARD FOR CAMERA MODULE

(71) Applicant: SAMSUNG ELECTRO-MECHANICS CO., LTD., Suwon (KR)

(72) Inventors: Dae Hyun Park, Suwon (KR); Han Kim, Yongin (KR); Seong Hee Choi, Suwon (KR); Mi Ja Han, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 86 days.

(21) Appl. No.: 14/464,362

(22) Filed: Aug. 20, 2014

(65) Prior Publication Data

US 2015/0340753 A1  Nov. 26, 2015

(30) Foreign Application Priority Data

May 23, 2014  (KR) .................. 10-2014-0062412

(51) Int. Cl.
| | |
|---|---|
| H01P 5/19 | (2006.01) |
| H03H 7/38 | (2006.01) |
| H01P 3/08 | (2006.01) |
| H01L 23/64 | (2006.01) |
| H05K 1/02 | (2006.01) |

(52) U.S. Cl.
CPC . *H01P 5/19* (2013.01); *H01P 3/08* (2013.01); *H03H 7/38* (2013.01); *H05K 1/0253* (2013.01); *H01L 23/64* (2013.01); *H05K 1/0245* (2013.01); *H05K 2201/09263* (2013.01)

(58) Field of Classification Search
None
See application file for complete search history.

(56) References Cited

U.S. PATENT DOCUMENTS

| | | | |
|---|---|---|---|
| 2005/0146390 A1* | 7/2005 | Baek | H01P 5/02 333/33 |
| 2006/0061432 A1* | 3/2006 | Hsu | H01P 3/08 333/33 |
| 2007/0090398 A1* | 4/2007 | McKinzie | H01P 1/20 257/192 |
| 2008/0266028 A1* | 10/2008 | Wyland | H01L 23/64 333/204 |
| 2008/0316117 A1* | 12/2008 | Hill | H01Q 1/243 343/702 |

FOREIGN PATENT DOCUMENTS

KR  10-2012-0050175  5/2012

* cited by examiner

*Primary Examiner* — Angel Roman
(74) *Attorney, Agent, or Firm* — NSIP Law

(57) ABSTRACT

A printed circuit board includes a signal transmitting part and a ground part disposed having an insulating layer therebetween. The ground part includes an impedance adjusting part.

31 Claims, 15 Drawing Sheets 121  122

138(130-1)

120

PRINTED CIRCUIT BOARD AND PRINTED CIRCUIT BOARD FOR CAMERA MODULE

CROSS-REFERENCE TO RELATED APPLICATIONS

This application claims the foreign priority benefit under 35 U.S.C. Section 119 of Korean Patent Application Serial No. 10-2014-0062412 entitled "Printed Circuit Board and Printed Circuit Board for Camera Module" filed on May 23, 2014, which is hereby incorporated by reference in its entirety into this application.

BACKGROUND

1. Field

Embodiments of the present invention relate to a printed circuit board and a printed circuit board for a camera module.

2. Description of the Related Art

In describing kinds of transmission lines and associated electromagnetic fields, transmission lines may be generally classified into microstrip line and stripline, both which have ground and electrical fields formed by a signal line. In this case, the formed electrical field influences characteristic impedance.

In the microstrip line and the strip line as described above, the impedance characteristic is determined by a line width and thickness of the signal line, a height between the signal line and a ground pattern, and a dielectric constant ∈r of a medium that forms an insulating layer.

However, if impedances of the respective components and circuits are not matched, an integrated circuit (IC) may be destroyed or energy loss may be caused by a reflected wave.

SUMMARY

An aspect of the present invention is to provide a printed circuit board and a printed circuit board for a camera module capable of adjusting impedance.

Another aspect of the present invention is to provide a printed circuit board and a printed circuit board for a camera module capable of having characteristics of both impedance adjustment and warpage prevention.

According to an exemplary embodiment of the present invention, there is provided a printed circuit board including: a signal transmitting part and a ground part disposed having an insulating layer therebetween, wherein the ground part includes an impedance adjusting part.

The signal transmitting part may include at least one signal line, and the impedance adjusting part may include a conductor pattern having a path longer than the signal line.

The conductor pattern may include a plurality of unit patterns having an open curve shape.

The open curve may have a U shape.

The unit pattern having the open curve shape may include at least one sub-unit pattern.

The sub-unit pattern may have the open curve shape.

The sub-unit pattern may have a closed curve shape.

At least one unit pattern having a close curve shape may be included between the unit patterns having the open curve shape.

The conductor pattern may form one path by connecting the plurality of unit patterns to one other.

The conductor pattern may include a plurality of unit patterns having a closed curve shape.

The conductor pattern may be formed so that a ratio deviation of the conductor pattern for each corresponding region in corresponding regions of the signal transmitting part and the ground part is minimized.

The conductor pattern may be formed so that a ratio deviation of the conductor pattern for each region in the ground part is minimized.

When the conductor pattern including the plurality of unit patterns having the open curve shape and the conductor pattern including a plurality of unit patterns having a closed curve shape have the same ratio as the conductor pattern in the ground part, impedance formed by the conductor pattern including the plurality of unit patterns having the open curve shape may be larger than impedance formed by the conductor pattern including the plurality of unit patterns having the closed curve shape.

According to another exemplary embodiment of the present invention, there is provided a printed circuit board for a camera module, including: a signal transmitting part transmitting a control signal; and a ground part providing a ground to the signal transmitting, wherein the ground part includes a first impedance adjusting part.

The signal transmitting part may include at least one signal line, and the first impedance adjusting part may include a conductor pattern having a path longer than the signal line.

The conductor pattern may include a plurality of unit patterns having an open curve shape.

The conductor pattern may form one path by connecting the plurality of unit patterns to one other.

The conductor pattern may include a plurality of unit patterns having a closed curve shape.

The conductor pattern may be formed so that a ratio deviation of the conductor pattern for each corresponding region in corresponding regions of the signal transmitting part and the ground part is minimized.

The conductor pattern may be formed so that a ratio deviation of the conductor pattern for each region in the ground part is minimized.

When the conductor pattern including the plurality of unit patterns having the open curve shape and the conductor pattern including a plurality of unit patterns having a closed curve shape have the same ratio as the conductor pattern in the ground part, impedance formed by the conductor pattern including the plurality of unit patterns having the open curve shape may be larger than impedance formed by the conductor pattern including the plurality of unit patterns having the closed curve shape.

The printed circuit board for the camera module may further include a sensor mounting part mounting a sensor to which the control signal is provided, wherein the sensor mounting part may include a second impedance adjusting part.

The second impedance adjusting part may include a conductor pattern having a path longer than the signal line.

The conductor pattern of the second impedance adjusting part may include a plurality of unit patterns having an open curve shape.

The conductor pattern of the second impedance adjusting part may include a plurality of unit patterns having a closed curve shape.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

The acting effects and technical configuration with respect to the objects of a printed circuit board and a printed circuit board for a camera module according to the present invention will be clearly understood by the following description in which exemplary embodiments of the present invention are described with reference to the accompanying drawings.

Further, when it is determined that the detailed description of the known art related to the present invention may obscure the gist of the present invention, the detailed description thereof will be omitted. In the description, the terms.

Printed Circuit Board

First Exemplary Embodiment

Figure 1A:
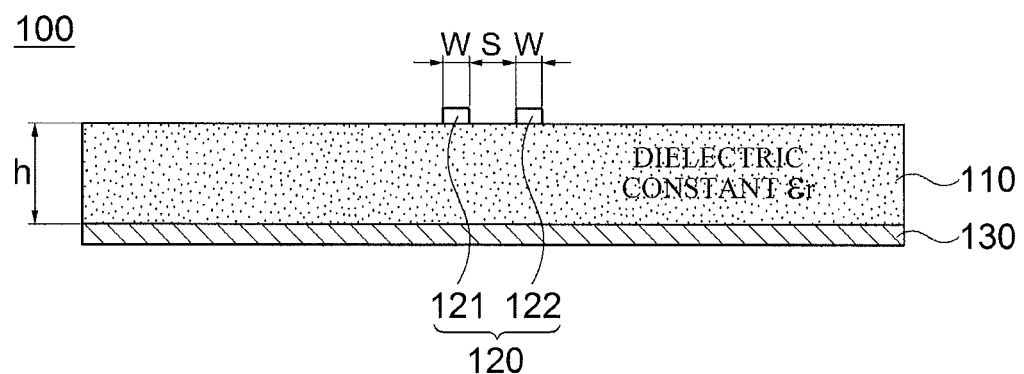
FIGS. 1A and 1B are cross-sectional views of a printed circuit board according to a first exemplary embodiment of the present invention.
Figure 1B:
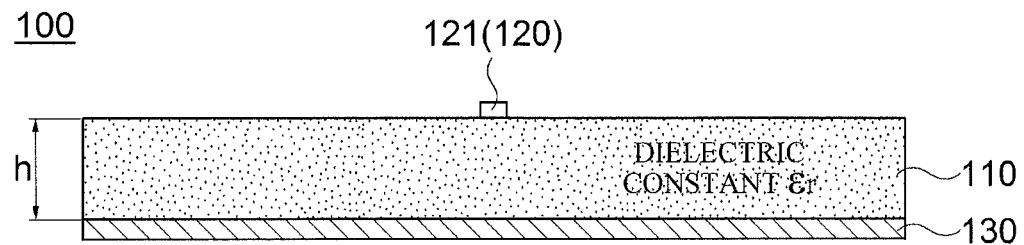

FIGS. 1A and 1B are cross-sectional views of a printed circuit board according to the present exemplary embodiment.

In a printed circuit board 100 according the present exemplary embodiment, a signal transmitting part 120 and a ground part 130 may be disposed so as to have an insulating layer 110 therebetween. For example, as shown in FIG. 1A, the signal transmitting part 120 may be disposed on an upper portion of the insulating layer 110 and the ground part 130 may be disposed on a lower portion of the insulating part 110. However, the present invention is not limited thereto, but any structure may be used as long as it has a structure in which the signal transmitting part 120 and the ground part 130 may be disposed having the insulating layer 110 therebetween.

The insulating layer 110 may be formed of a medium having a dielectric constant $\in_r$, and may have a predetermined height h according to a size of a product which is used.

In this case, as the insulating layer 110, a resin insulating layer may be used. For example, a material of the resin insulating layer, a thermo-setting resin such as an epoxy resin, a thermo-plastic resin such as a polyimide resin, or a resin having a reinforcement material such as a glass fiber or an inorganic filler impregnated in the thermo-setting resin and the thermo-plastic resin, for example, a prepreg may be used. In addition, a thermo-setting resin, a photo-curable resin, and/or the like, may be used. However, the present disclosure is not particularly limited thereto.

Further, the printed circuit board 100 according to the present exemplary embodiment in which the above-mentioned insulating layer 110 is used may be a single layer board formed by the insulating layer and may be a multilayer board in which a plurality of insulating layers and a plurality of circuit layers are alternately stacked.

Meanwhile, the signal transmitting part 120 according to the present exemplary embodiment may include one or more signal lines 121 and 122, for example, a pair of signal lines 121 and 122 which have a predetermined width W and are disposed at a predetermined interval S to be extended along a length direction, as shown in FIG. 1A. The pair of signal lines 121 and 122 may be two lanes supporting a mobile industry processor interface (MIPI).

Here, the MIPI refers to a new specification of a serial interface connecting a control signal between a processor in a mobile device and periphery devices and may be used to transmit and receive data between a camera module for mobile and a main processor in the present exemplary embodiment.

Particularly, the signal lines used in the MIPI of the camera module are differential pair lines, in which if impedances are not matched, signal transmitting characteristic may be degraded, thereby causing problems such as image noise, and the like.

However, the present invention is not limited to only the configuration of the signal lines (i.e., the pair of signal lines) shown in FIG. 1A. For example, any configuration may be used as long as the signal transmitting part 120 includes one or more signal lines. Accordingly, the signal transmitting part 120 according to the present exemplary embodiment may include the pair of signal lines or more and may include only a single signal line 121, as shown in FIG. 1B.

In addition, the signal lines 121 and 122, which are to transmit the control signal, may be formed by a conductor pattern formed of at least one material or a mixture of at least two materials selected from silver (Ag), palladium (Pd), aluminum (Al), nickel (Ni), titanium (Ti), gold (Au), copper (Cu), or platinum (Pt) having excellent electrical conductivity.

Meanwhile, in the printed circuit board 100 according to the present exemplary embodiment, only the insulating layer 110 is present between the signal lines 121 and 122 and the ground part 130, thereby making it possible to prevent interference of a signal from electromagnetic field generated by concentration of alternating current energy in high frequency.

Impedance characteristic in the structure of the signal lines 121 and 122 as in the present exemplary embodiment is influenced by the line width W of the signal lines 121 and 122, the height h between the signal lines 121 and 122 and the ground part 130, and the dielectric constant $\in_r$ of the medium configuring the insulating layer. In this case, when the high frequency is formed, almost all energy components of the signal between the signal lines 121 and 122 and the ground part 130 are progressed while being formed in an alternating current field form.

Accordingly, the signal lines 121 and 122 are disposed on the upper surface of the insulating layer 110 while having a constant line width W according to a condition of height h/dielectric constant $\in_r$ of the insulating layer 110, thereby configuring the circuit.

In addition, the signal lines 121 and 122 may be formed by a photo etching method, or the like. Since the influence caused by the line width of the signal lines 121 and 122 may not be neglected when a frequency becomes high, the line width W of the signal lines 121 and 122 may be formed to be fine when the impedance is low.

Meanwhile, the ground part 130 according to the present exemplary embodiment, which may provide a ground to the signal lines 121 and 122, may include a conductor pattern formed of at least one material or a mixture of at least two materials selected from silver (Ag), palladium (Pd), aluminum (Al), nickel (Ni), titanium (Ti), gold (Au), copper (Cu), or platinum (Pt) having excellent electrical conductivity, similar to the signal lines 121 and 122.

In this case, the ground part 130 may include an impedance adjusting part 130-1 capable of adjusting the impedance of the printed circuit board 100, where the impedance adjusting part 130-1 may include a conductor pattern having a path longer than the signal lines 121 and 122.

Examples of the conductor pattern included in the ground part 130 as the impedance adjusting part 130-1 as described above are shown in FIGS. 2 through 9.

Among those drawings, FIGS. 2 through 8 show examples of the conductor pattern including a plurality of unit patterns having an open curve shape. First, describing an example of the conductor pattern 131 shown in FIG. 2, the conductor pattern 131 may include a plurality of unit patterns A, B, C, etc formed to intersect with the signal lines 121 and 122.

Figure 2:
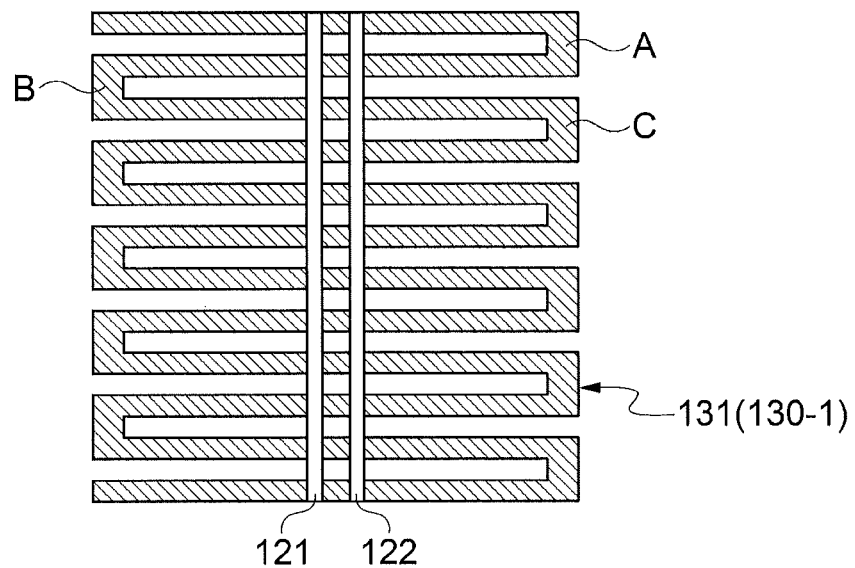
FIGS. 2 through 9 are illustration views of conductor patterns of an impedance adjusting part according to the first exemplary embodiment of the present invention.

In this case, the unit patterns A, B, C, etc may have the open curve shape. For example, the unit patterns A, B, C, etc of the conductor pattern 131 may have the open curve shape of a U shape as shown in FIG. 2. However, the shape of the unit patterns A, B, C, etc according to the present invention is not limited to the shape shown in FIG. 2. For example, any form of unit pattern may be used as long as it has the open curve shape.

In addition, the conductor pattern 131 may form one path by connecting the plurality of unit patterns A, B, C, etc to one another. Thereby, the conductor pattern 131 having a winding form may be formed as shown in FIG. 2.

Meanwhile, the conductor pattern included in the ground part 130 as the impedance adjusting part 130-1 may also be implemented in a form in which each of the plurality of unit patterns having the open curve shape includes at least one a sub-unit pattern, as shown in FIGS. 3 through 7.

Among these drawings, FIGS. 3 through 6 show examples of the conductor pattern in which the sub-unit pattern has the open curve shape. First, describing an example of a conductor pattern 132 shown in FIG. 3, a basic structure of the conductor pattern 132 is similar to that of the conductor pattern 131 of FIG. 2.

Figure 3:
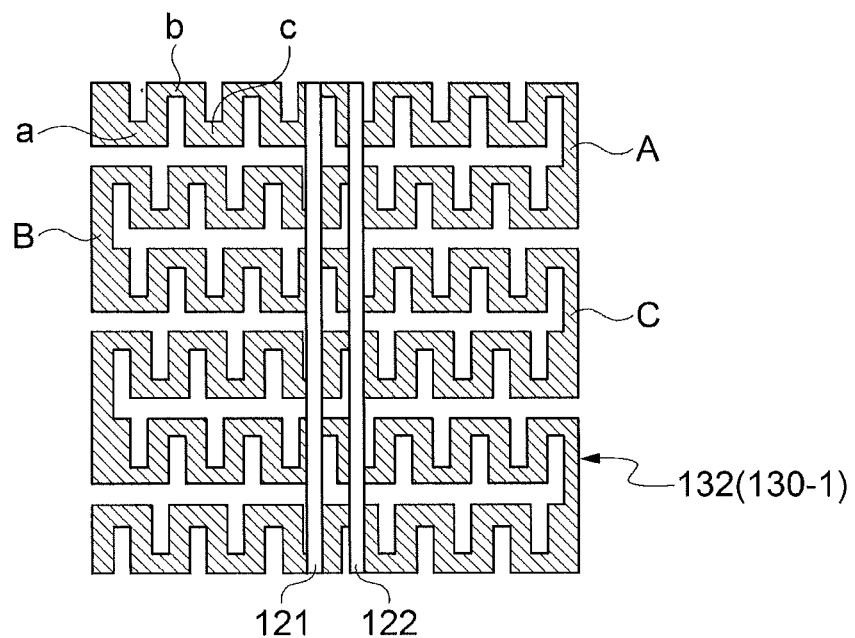

That is, the conductor pattern 132 of FIG. 3 may include a plurality of unit patterns A, B, C, etc formed to intersect with the above-mentioned signal lines 121 and 122. In this case, the unit patterns A, B, C, etc may have the open curve shape.

In addition, the conductor pattern 132 may form one path by connecting the plurality of unit patterns A, B, C, etc to one another. Thereby, the conductor pattern 132 having a winding form may be formed as shown in FIG. 3.

However, in the conductor pattern 132 of FIG. 3, unlike the conductor pattern 131 of FIG. 2, each of the unit patterns A, B, C, etc may be implemented in a form in which it includes at least one sub-unit patterns a, b, c, etc having the open curve shape.

Although FIG. 3 shows a case in which the unit patterns A, B, C, etc include a plurality of sub-unit patterns a, b, c, etc having the open curve shape, the present invention is not limited thereto and the unit patterns A, B, C, etc may include only one sub-unit pattern having the open curve shape.

The conductor pattern 132 configured as described above may be formed in a more winding form than the conductor pattern 131 of FIG. 2 by having the unit patterns A, B, C, etc including the at least one sub-unit patterns a, b, c, etc having the open curve shape, as shown in FIG. 3.

In addition, the sub-unit patterns a, b, c, etc may have a U shape, for example, as shown in FIG. 3. However, the present invention is not limited to thereto. For example, the sub-unit pattern having any shape may be used as long as the shape thereof may be included in the unit patterns.

Figure 4:
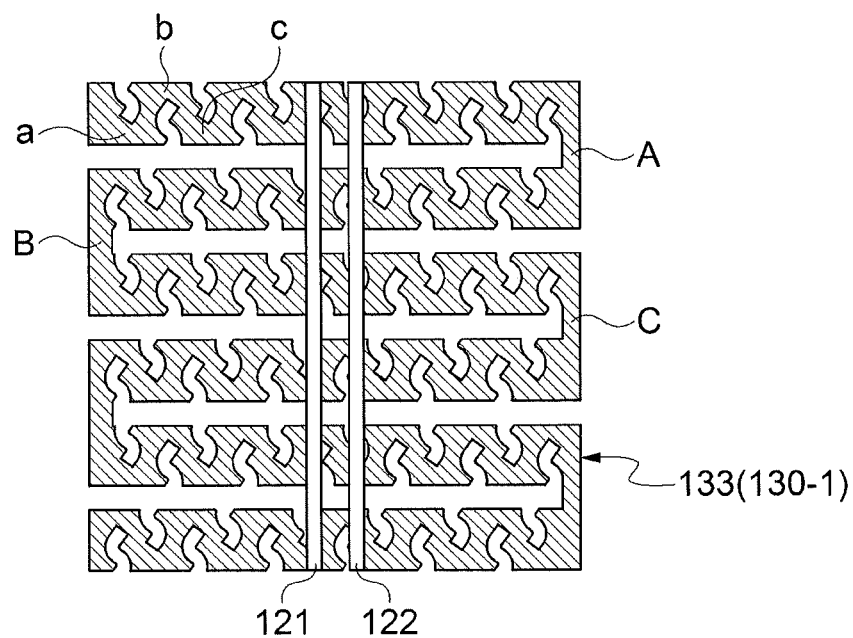

Next, describing an example of a conductor pattern 133 shown in FIG. 4, a basic structure of the conductor pattern 133 is similar to that of the conductor pattern 132 of FIG. 3.

That is, the conductor pattern 133 of FIG. 4 may include a plurality of unit patterns A, B, C, etc formed to intersect with the above-mentioned signal lines 121 and 122. In this case, the unit patterns A, B, C, etc may have the open curve shape.

In addition, the conductor pattern 133 may form one path by connecting the plurality of unit patterns A, B, C, etc to one another. Thereby, the conductor pattern 133 having a winding form may be formed as shown in FIG. 4.

In addition, each of the unit patterns A, B, C, etc of the conductor pattern 133 may be implemented in a form in which it includes at least one sub-unit patterns a, b, c, etc having the open curve shape.

Although FIG. 4 shows a case in which the unit patterns A, B, C, etc include a plurality of sub-unit patterns a, b, c, etc having the open curve shape, the present invention is not limited thereto and the unit patterns A, B, C, etc may include only one sub-unit pattern having the open curve shape.

The conductor pattern 133 configured as described above may be formed in a more winding form than the conductor pattern 131 of FIG. 2, similar to FIG. 3 by having the unit patterns A, B, C, etc including the at least one sub-unit patterns a, b, c, etc having the open curve shape, as shown in FIG. 4.

However, the sub-unit patterns a, b, c, etc may form a non-pattern region of an S shape, unlike the sub-unit pattern of FIG. 3 forming a non-pattern region of the U shape. However, the present invention is not limited to thereto. For example, the sub-unit pattern having any shape may be used as long as the shape thereof may be included in the unit patterns A, B, C, etc.

Figure 5:
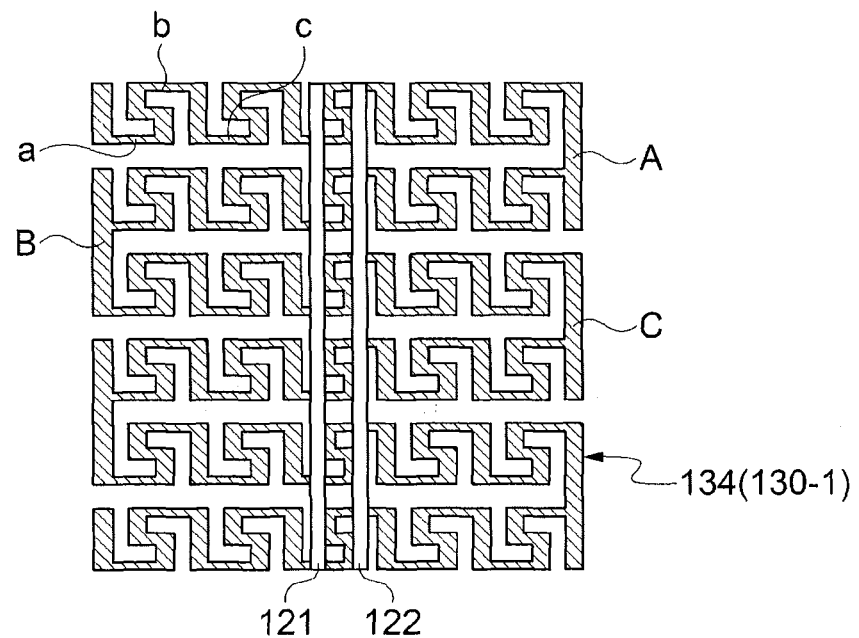

Next, describing an example of a conductor pattern 134 shown in FIG. 5, a basic structure of the conductor pattern 134 is similar to those of the conductor patterns 132 and 133 of FIGS. 3 and 4.

That is, the conductor pattern 134 of FIG. 5 may include a plurality of unit patterns A, B, C, etc formed to intersect with the above-mentioned signal lines 121 and 122. In this case, the unit patterns A, B, C, etc may have the open curve shape.

In addition, the conductor pattern 134 may form one path by connecting the plurality of unit patterns A, B, C, etc to one another. Thereby, the conductor pattern 134 having a winding form may be formed as shown in FIG. 5.

In addition, each of the unit patterns A, B, C, etc of the conductor pattern 134 may be implemented in a form in which it includes at least one sub-unit patterns a, b, c, etc having the open curve shape.

Although FIG. 5 shows a case in which the unit patterns A, B, C, etc include a plurality of sub-unit patterns a, b, c, etc having the open curve shape, the present invention is not limited thereto and the unit patterns A, B, C, etc may include only one sub-unit pattern having the open curve shape.

The conductor pattern 134 configured as described above may be formed in a more winding form than the conductor pattern 131 of FIG. 2, similar to FIGS. 3 and 4 by having the unit patterns A, B, C, etc including the at least one sub-unit patterns a, b, c, etc having the open curve shape, as shown in FIG. 5.

However, the sub-unit patterns a, b, c, etc of the conductor pattern 134 may form a non-pattern region having a L shape or a L shape, unlike FIGS. 3 and 4. However, the present invention is not limited to thereto. For example, the sub-unit pattern having any shape may be used as long as the shape thereof may be included in the unit patterns A, B, C, etc.

Figure 6:
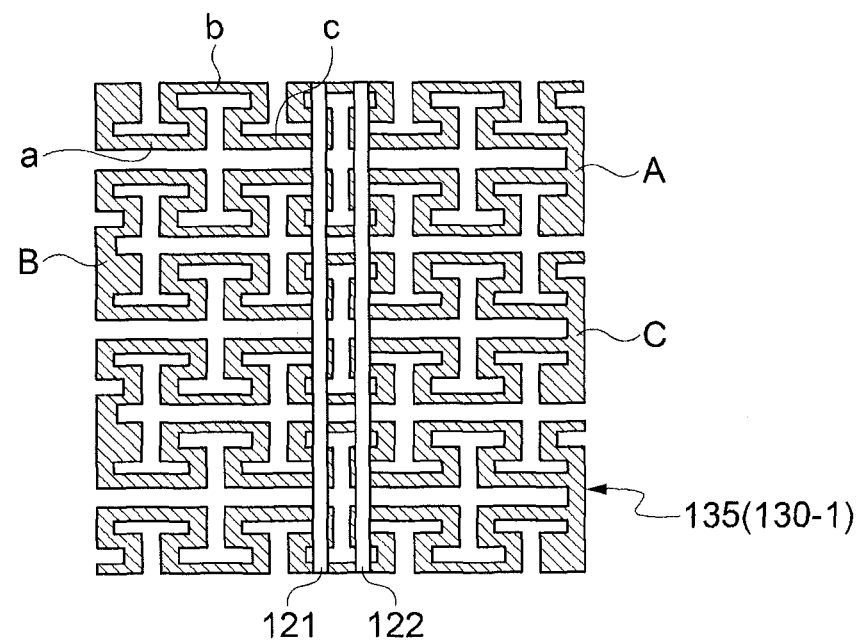

Next, describing an example of a conductor pattern 135 shown in FIG. 6, a basic structure of the conductor pattern 135 is similar to those of the conductor patterns 132 through 134 of FIGS. 3 through 5.

That is, the conductor pattern 135 of FIG. 6 may include a plurality of unit patterns A, B, C, etc formed to intersect with the above-mentioned signal lines 121 and 122. In this case, the unit patterns A, B, C, etc may have the open curve shape.

In addition, the conductor pattern 135 may form one path by connecting the plurality of unit patterns A, B, C, etc to one another. Thereby, the conductor pattern 135 having a winding form may be formed as shown in FIG. 6.

In addition, each of the unit patterns A, B, C, etc of the conductor pattern 135 may be implemented in a form in which it includes at least one sub-unit patterns a, b, c, etc having the open curve shape.

Although FIG. 6 shows a case in which the unit patterns A, B, C, etc include a plurality of sub-unit patterns a, b, c, etc having the open curve shape, the present invention is not limited thereto and the unit patterns A, B, C, etc may include only one sub-unit pattern having the open curve shape.

The conductor pattern 135 configured as described above may be formed in a more winding form than the conductor pattern 131 of FIG. 2, similar to FIGS. 3 through 5 by having the unit patterns A, B, C, etc including the at least one sub-unit patterns a, b, c, etc having the open curve shape, as shown in FIG. 6.

However, the sub-unit patterns a, b, c, etc of the conductor pattern 135 may form a non-pattern region having a ⊥ shape or a T shape, unlike FIGS. 3 through 5. However, the present invention is not limited to thereto. For example, the sub-unit pattern having any shape may be used as long as the shape thereof may be included in the unit patterns A, B, C, etc.

Figure 7:
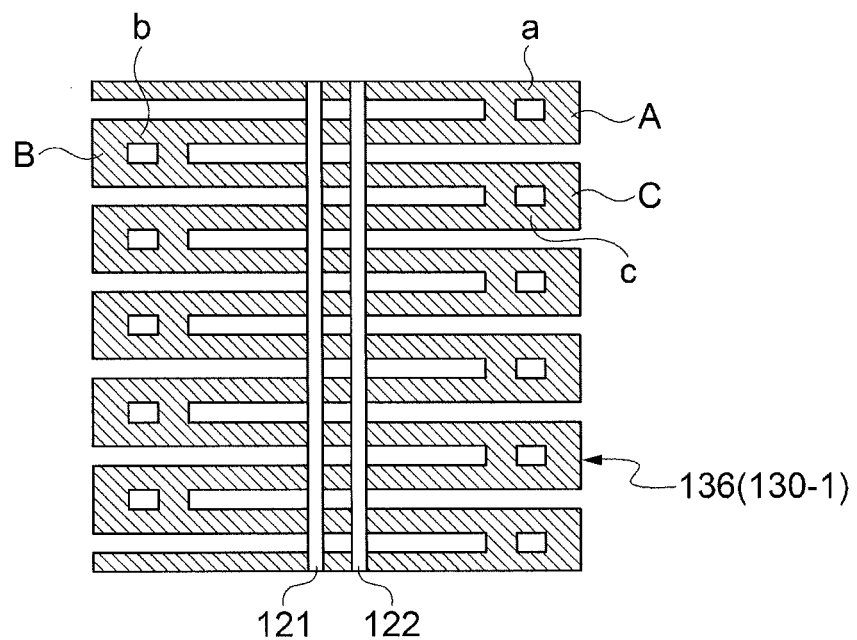

Meanwhile, FIG. 7 shows an example of a conductor pattern in which a sub-unit pattern included in each of a plurality of unit patterns having an open curve shape has a closed curve shape.

Describing an example of a conductor pattern 136 shown in FIG. 7, a basic structure of the conductor pattern 136 is similar to those of the conductor patterns 131 through 135 of FIGS. 2 through 6.

That is, the conductor pattern 136 of FIG. 7 may include a plurality of unit patterns A, B, C, etc formed to intersect with the above-mentioned signal lines 121 and 122. In this case, the unit patterns A, B, C, etc may have the open curve shape.

In addition, the conductor pattern 136 may form one path by connecting the plurality of unit patterns A, B, C, etc to one another. Thereby, the conductor pattern 136 having a winding form may be formed as shown in FIG. 7.

However, in the conductor pattern 136 of FIG. 7, unlike the conductor patterns 131 through 135 of FIGS. 2 through 6, each of the unit patterns A, B, C, etc may be implemented in a form in which it includes at least one sub-unit patterns a, b, c, etc having the closed curve shape.

Although FIG. 7 shows a case in which the unit patterns A, B, C, etc include only one sub-unit pattern a, b, c, etc having the closed curve shape, the present invention is not limited thereto and the unit patterns A, B, C, etc may include a plurality of sub-unit patterns having the closed curve shape.

The conductor pattern 136 configured as described above may be formed in a more winding form than the conductor pattern 131 of FIG. 2 by having the unit patterns A, B, C, etc including the at least one sub-unit patterns a, b, c, etc having the closed curve shape, as shown in FIG. 7.

Figure 8:
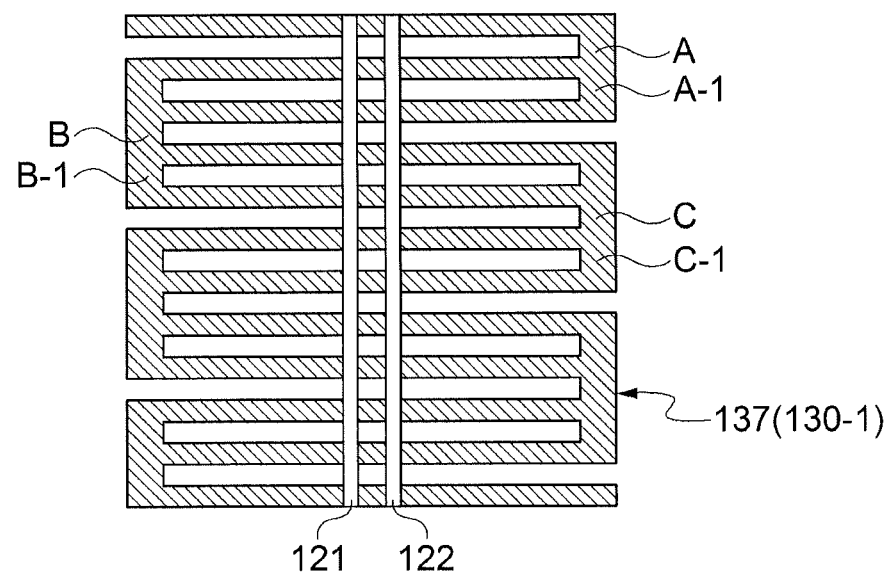

Meanwhile, the conductor pattern included in the ground part 130 as the impedance adjusting part 130-1 may also be implemented in a form in which it includes at least one unit patterns A-1, B-1, etc having the closed curve shape between the plurality of unit patterns A, B, C, etc having the open curve shape, as shown in FIG. 8.

Describing an example of a conductor pattern 137 shown in FIG. 8, a basic structure of the conductor pattern 137 is similar to those of the conductor patterns 131 through 136 of FIGS. 2 through 7.

That is, the conductor pattern 137 of FIG. 8 may include a plurality of unit patterns A, B, C, etc formed to intersect with the above-mentioned signal lines 121 and 122. In this case, the unit patterns A, B, C, etc may have the open curve shape.

In addition, the conductor pattern 137 may form one path by connecting the plurality of unit patterns A, B, C, etc to one another. Thereby, the conductor pattern 137 having a winding form may be formed as shown in FIG. 8.

However, unlike the conductor patterns 131 through 136 of FIGS. 2 through 7, the conductor pattern 137 of FIG. 8 may be implemented in a form in which it includes at least one unit patterns A-1, B-1, etc having the closed curve shape between the respective unit patterns A, B, C, etc.

Although FIG. 8 shows a case in which the only one unit pattern A-1, B-1, etc having the closed curve shape is included between the unit patterns A, B, C, etc, the present invention is not limited thereto and a plurality of unit patterns having the closed curve shape may be included between the unit patterns A, B, C, etc.

The conductor pattern 137 configured as described above may be formed in a more winding form than the conductor pattern 131 of FIG. 2 by including the at least one unit patterns A-1, B-1, etc having the closed curve shape between the unit patterns A, B, C, etc, as shown in FIG. 8.

As shown in FIGS. 1 through 8, the ground part is comprised of rows of conductive patterns that extends from a position on one side of the signal transmitting part (e.g., a position to the left of signal line 121 under the shown plan views) to a position on another side of the signal line (e.g., a position to the right of signal line 122 under the shown plan views).

Figure 9:
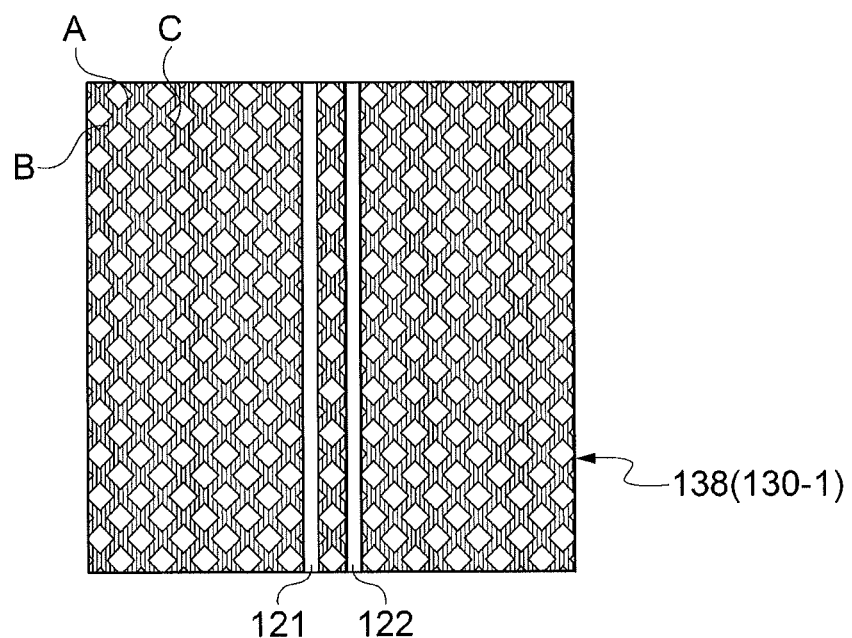

Meanwhile, FIG. 9 shows an example of a conductor pattern including a plurality of unit patterns having a closed curve shape.

Referring to FIG. 9, a conductor pattern 138 included in the ground part 130 as the impedance adjusting part 130-1 is similar to the conductor patterns 131 through 137 of FIGS. 2 through 8 in that it may include a plurality of unit patterns A, B, C, etc formed to intersect with the above-mentioned signal lines 121 and 122.

However, in the conductor pattern 138 of FIG. 9, unlike the conductor patterns 131 through 137 of FIGS. 2 through 8, each of the unit patterns A, B, C, etc may be implemented in the closed curve shape.

In this case, although FIG. 9 shows a case of the plurality of unit patterns A, B, C, etc having a rhombus closed curve shape, the shape of the unit patterns A, B, C, etc according to the present invention is not limited to the shape as shown in FIG. 9. For example, any form of unit pattern may be used as long as it has the closed curve shape.

As described above, the printed circuit board 100 according to the present exemplary embodiment may adopt the shape of the conductor pattern (ground pattern) included in the ground part 130 as the shapes illustrated in FIGS. 2 through 9.

Therefore, the printed circuit board 100 according to the present exemplary embodiment may adjust a length of a signal feedback path in the ground part 130 by using the shape of the ground pattern as described above and may adjust impedance accordingly, which will be described below.

Figure 10A:
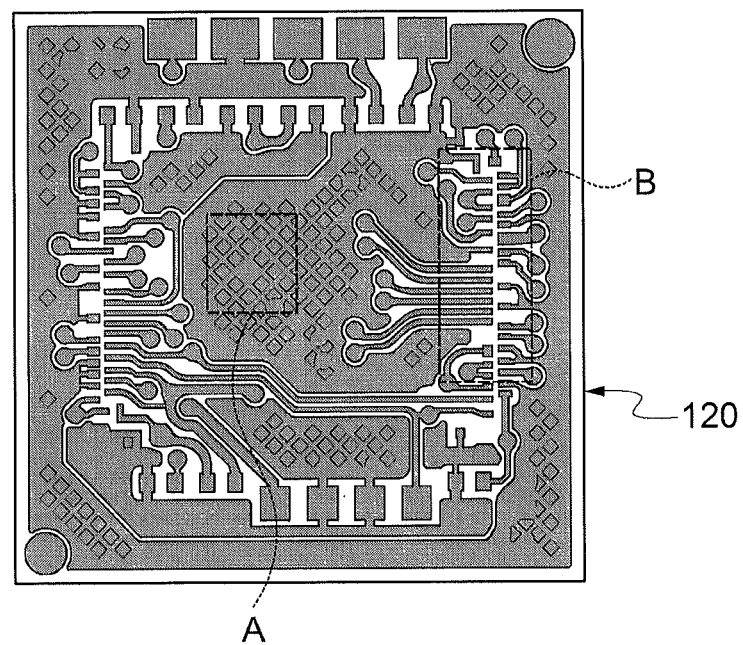
FIG. 10A is an illustrative plan view of a signal transmitting part according to the first exemplary embodiment of the present invention.
Figure 10B:
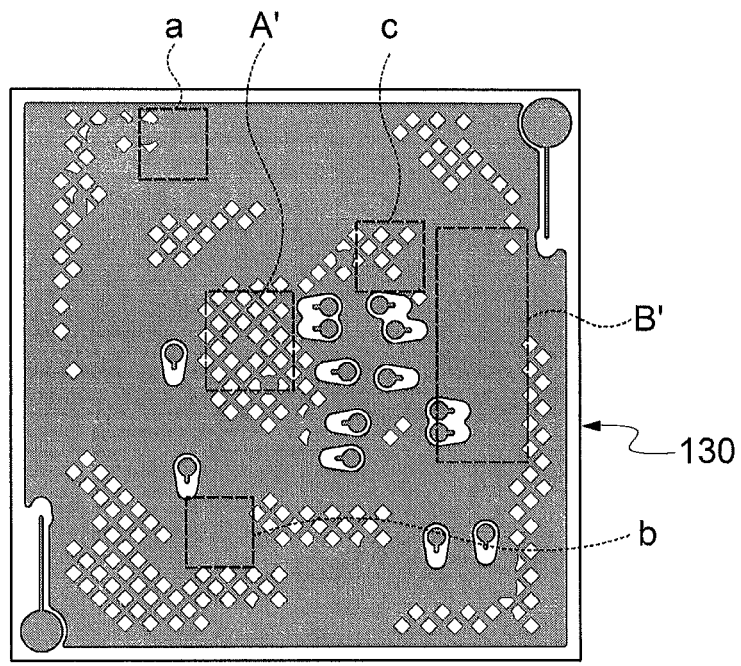
FIG. 10B is an illustrative plan view of a ground part according to the first exemplary embodiment of the present invention.

Meanwhile, FIG. 10A is an illustrative plan view of a signal transmitting part 120 according to the present exemplary embodiment and FIG. 10B is an illustrative plan view of a ground part 130 according to the present exemplary embodiment. Here, hatched portions show portions occupied by a conductor pattern for the respective layer and unhatched portions show portions which are not occupied by the conductor pattern of the respective layer.

As shown in FIGS. 10A and 10B, the conductor pattern may be formed in a ground part region A' so that a ratio of the conductor pattern of ground part region A' is relatively low. Ground part region A' corresponds to a signal transmitting part region A having a relatively high conductor pattern ratio.

In addition, the conductor pattern may be formed in a ground part region B' so that a ratio of the conductor pattern of ground part region B' is relatively high. Ground part region B' corresponds to a signal transmitting part region B having a relatively low conductor pattern ratio By including the conductor pattern in the ground part 130 by the configuration as described above, a first corresponding region A-A' of the signal transmitting part 120 and the ground part 130 and a second corresponding region B-B' of the signal transmitting part 120 and the ground part 130 minimize a ratio deviation of the conductor patterns formed in the respective corresponding regions. Similarly, a ratio deviation of the conductor patterns formed in other corresponding regions other than the first and second corresponding region A-A' and B-B' may also be minimized.

That is, by including the conductor pattern according to the present exemplary embodiment in the ground part 130 as the configuration as shown in FIG. 10B, the conductor pattern may be formed so that the ratio deviation of the conductor pattern for each corresponding region in the corresponding regions of the signal transmitting part 120 and the ground part 130 is minimized.

In other words, according to the exemplary embodiment, a conductor ratio of the ground pattern implemented on the board may be formed to have a minimized deviation in relation to a signal pattern.

Therefore, in the case in which the conductor pattern according to the present exemplary embodiment is included in the ground part 130 as the configuration as shown in FIG. 10B, non-uniformity of the conductor ratio between the signal transmitting part 120 and the ground part 130, that is, non-uniformity of the conductor ratio between upper and lower layers of the printed circuit board 100 in the present exemplary embodiment may be improved.

Accordingly, since an occurrence of warpage of the printed circuit board 100 caused by the above-mentioned non-uniformity may be significantly decreased, warpage preventing characteristic may also be significantly improved, which will be described below.

Figure 11:
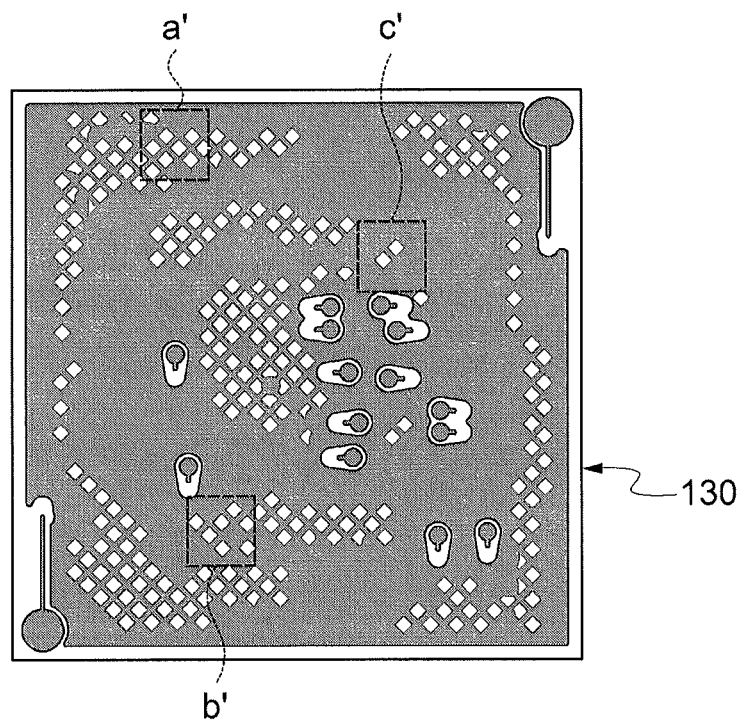
FIG. 11 is a view showing a case in which a ratio of a conductor pattern is adjusted for each region in the ground part of FIG. 10B.

FIG. 11 shows a view in which a ratio of a conductor pattern is adjusted for each region in the ground part 130 of FIG. 10B. Here, similar to FIGS. 10A and 10B, hatched portions show portions occupied by the conductor pattern and unhatched portions show portions which are not occupied by the conductor pattern.

As shown in FIGS. 10B and 11, the conductor pattern may be formed in a ground part region in FIG. 10B (a and b in FIG. 10B) having a relatively high ratio of the conductor pattern so that a ratio of the conductor pattern is relatively low (a' and b' in FIG. 11).

In addition, the conductor pattern may be formed in a ground part region in FIG. 10B (c in FIG. 10B) having a relatively low ratio of the conductor pattern so that a ratio of the conductor pattern is relatively high (c' in FIG. 11).

By including the conductor pattern in the ground part 130 of FIG. 10B as the configuration as shown in FIG. 11, a ratio deviation of the conductor patterns formed in the respective regions in the ground part 130 may also be minimized.

That is, by including the conductor pattern in the ground part 130 of FIG. 10B as the configuration as shown in FIG. 11, the conductor pattern may be formed so that the ratio deviation of the conductor pattern for each corresponding region in the corresponding regions of the signal transmitting part 120 and the ground part 130 is minimized and may also be formed so that the ratio deviation of the conductor pattern for each region in the ground part 130 is minimized.

In other words, according to the exemplary embodiment, a conductor ratio of the ground pattern implemented on the board may be formed to have a minimized deviation in relation to a signal pattern and may also be formed to have a minimized deviation in relation to an adjacent ground pattern.

Therefore, in the case in which the conductor pattern is included in the ground part 130 of FIG. 10B as the configuration as shown in FIG. 11, non-uniformity of the conductor ratio between the signal transmitting part 120 and the ground part 130 as well as non-uniformity of the conductor ratio for each region in the ground part 130 may be improved.

Accordingly, since an occurrence of warpage of the printed circuit board 100 caused by the above-mentioned non-uniformity may be more decreased than the case of FIG. 10B, warpage preventing characteristic may also be more significantly improved than the case of FIG. 10B, which will also be described below.

Second Exemplary Embodiment

Figure 12A:
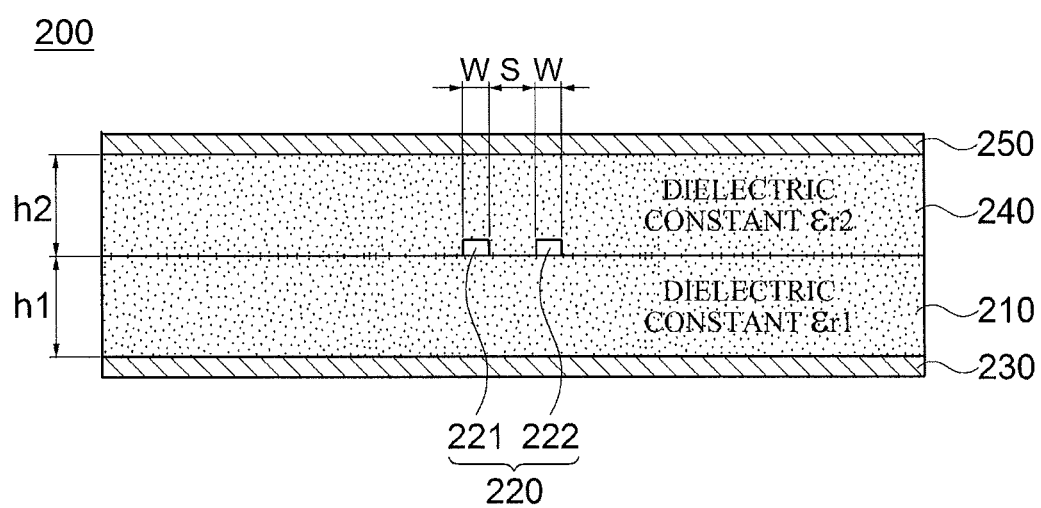
FIGS. 12A and 12B are cross-sectional views of a printed circuit board according to a second exemplary embodiment of the present invention.
Figure 12B:
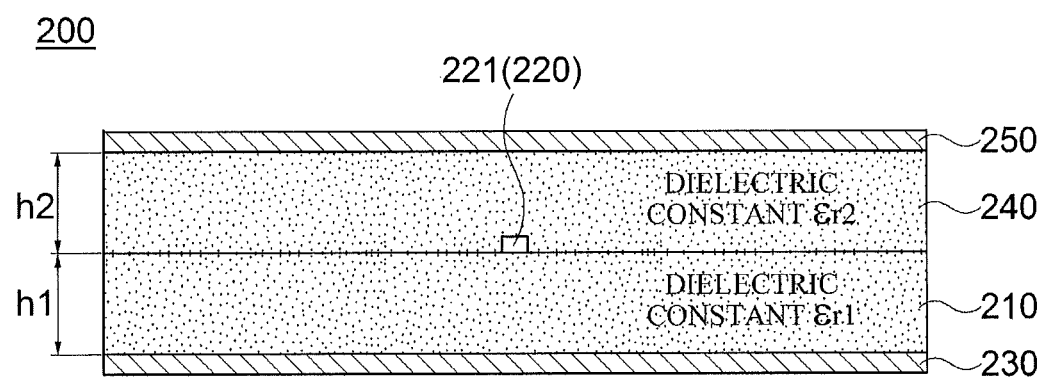

FIGS. 12A and 12B are cross-sectional views of a printed circuit board according to the present exemplary embodiment.

In a printed circuit board 200 according the present exemplary embodiment, a signal transmitting part and a ground part may be disposed having an insulating layer therebetween.

For example, as shown in FIG. 12A, a signal transmitting part 220 and a first ground part 230 may be disposed having a first insulating layer 210 therebetween and the signal transmitting part 220 and a second ground part 250 may be disposed having a second insulating layer 240 therebetween. However, the present invention is not limited thereto, but any structure may be used as long as it has a structure in which the signal transmitting part and the ground part may be disposed having the insulating layer therebetween.

The first insulating layer 210 may be formed of a medium having a dielectric constant $\in_{r1}$, and may have a predetermined height h1 according to a size of a product which is used.

In addition, the second insulating layer 240 may be formed of a medium having a dielectric constant $\in_{r2}$, and may have a predetermined height h2 according to a size of a product which is used.

In this case, as the insulating layers 210 and 240, similar to the first exemplary embodiment, a resin insulating layer may be used. For example, a material of the resin insulating layer, a thermo-setting resin such as an epoxy resin, a thermo-plastic resin such as a polyimide resin, or a resin having a reinforcement material such as a glass fiber or an inorganic filler impregnated in the thermo-setting resin and the thermo-plastic resin, for example, a prepreg may be used. In addition, a thermo-setting resin, a photo-curable resin, and/or the like, may be used. However, the present disclosure is not particularly limited thereto.

In addition, the insulating layers 210 and 240 according to the present exemplary embodiment may be formed of the same material, but the present invention is not limited thereto and the insulating layers 210 and 240 may be formed of different materials.

Further, the printed circuit board 200 according to the present exemplary embodiment in which the above-mentioned insulating layers 210 and 240 are used may be a single layer board formed by the insulating layer and may be a multi-layer board in which a plurality of insulating layers and a plurality of circuit layers are alternately stacked, similarly to the first exemplary embodiment.

Meanwhile, the signal transmitting part 220 according to the present exemplary embodiment may include at least one signal lines 221 and 222, for example, a pair of signal lines 221 and 222 which have a predetermined width W and are disposed at a predetermined interval S to be extended along a length direction, as shown in FIG. 12A. The pair of signal lines 221 and 222 may be two lanes supporting a mobile industry processor interface (MIPI).

Here, the MIPI refers to a new specification of a serial interface connecting a control signal between a processor in a mobile device and periphery devices and may be used to transmit and receive data between a camera module for mobile and a main processor in the present exemplary embodiment.

Particularly, the signal lines used in the MIPI of the camera module are differential pair lines, in which if impedances are not matched, signal transmitting characteristic may be degraded, thereby causing problems such as image noise, and the like.

However, the present invention is not limited to only the configuration of the signal lines (i.e., the pair of signal lines) shown in FIG. 12A. For example, any configuration may be used as long as the signal transmitting part 220 includes one or more signal lines. Accordingly, the signal transmitting part 220 according to the present exemplary embodiment may include the pair of signal lines or more and may include only a single signal line 221 as shown in FIG. 12B.

In addition, the signal lines 221 and 222, which are to transmit the control signal, may be formed by a conductor pattern formed of at least one material or a mixture of at least two materials selected from silver (Ag), palladium (Pd), aluminum (Al), nickel (Ni), titanium (Ti), gold (Au), copper (Cu), or platinum (Pt) having excellent electrical conductivity.

Meanwhile, in the printed circuit board 200 according to the present exemplary embodiment, the insulating layers 210 and 240 are present between the signal lines 221 and 222 and the ground parts 230 and 250, thereby making it possible to prevent interference of a signal from electromagnetic field generated by concentration of alternating current energy in high frequency.

Impedance characteristic in the structure of the signal lines 221 and 222 as in the present exemplary embodiment is influenced by the line width W of the signal lines 221 and 222, the heights h1 and h2 between the signal lines 221 and 222 and the ground parts 230 and 250, and the dielectric constants $\in_{r1}$ and $\in_{r2}$ and of the medium configuring the insulating layers 210 and 240. In this case, when the high frequency is formed, almost all energy components of the signal between the signal lines 221 and 222 and the ground parts 230 and 250 are progressed while being formed in an alternating current field form.

Accordingly, the signal lines 221 and 222 are disposed on upper surfaces of the insulating layers 210 and 240 while having a constant line width W according to a condition of heights h1 and h2/dielectric constants $\in_{r1}$ and $\in_{r2}$ of the insulating layers 210 and 240, thereby configuring the circuit.

In addition, the signal lines 221 and 222 may be formed by a photo etching method, or the like. Since the influence caused by the line width of the signal lines 221 and 222 may not be neglected when a frequency becomes high, the line width W of the signal lines 121 and 122 may be formed to be fine when the impedance is low.

Meanwhile, the ground parts 230 and 250 according to the present exemplary embodiment, which may provide a ground to the signal lines 221 and 222, may include a conductor pattern formed of at least one material or a mixture of at least two materials selected from silver (Ag), palladium (Pd), aluminum (Al), nickel (Ni), titanium (Ti), gold (Au), copper (Cu), or platinum (Pt) having excellent electrical conductivity, similar to the signal lines 221 and 222.

In this case, the ground parts 230 and 250 may include an impedance adjusting part capable of adjusting the impedance of the printed circuit board 200, where the impedance adjusting part may include a conductor pattern having a path longer than the signal lines 221 and 222, similar to the first exemplary embodiment.

Since the conductor patterns included in the ground parts 230 and 250 as the impedance adjusting part may have the same configuration and function as the conductor patterns illustrated in FIGS. 2 through 11, a detailed description thereof will be omitted in order to avoid an overlapped description.

As described above, the printed circuit board 200 according to the present exemplary embodiment may adopt the shape of the ground patterns included in the ground parts 230 and 250 as the shapes illustrated in FIGS. 2 through 9, similar to the first exemplary embodiment.

Therefore, the printed circuit board 200 according to the present exemplary embodiment may adjust lengths of signal feedback paths in the ground parts 230 and 250 by using the shapes of the ground patterns as described above and may adjust impedance accordingly, which will be described below.

Further, since the printed circuit board 200 may include the ground patterns having the shapes illustrated in FIGS. 2 to 9 in the ground parts 230 and 250 as the configuration as shown in FIG. 10B or 11, similar to the first exemplary embodiment, non-uniformity of conductor ratios between the signal transmitting part 220 and the ground parts 230 and 250 as well as non-uniformity of the conductor ratio for each region in the ground parts 230 and 250 may be improved.

Accordingly, in the printed circuit board 200 according to the present exemplary embodiment, since an occurrence of warpage of the printed circuit board 200 caused by the above-mentioned non-uniformity may be significantly decreased, warpage preventing characteristic may also be significantly improved, which will be described below.

Printed Circuit Board for Camera Module

Figure 13:
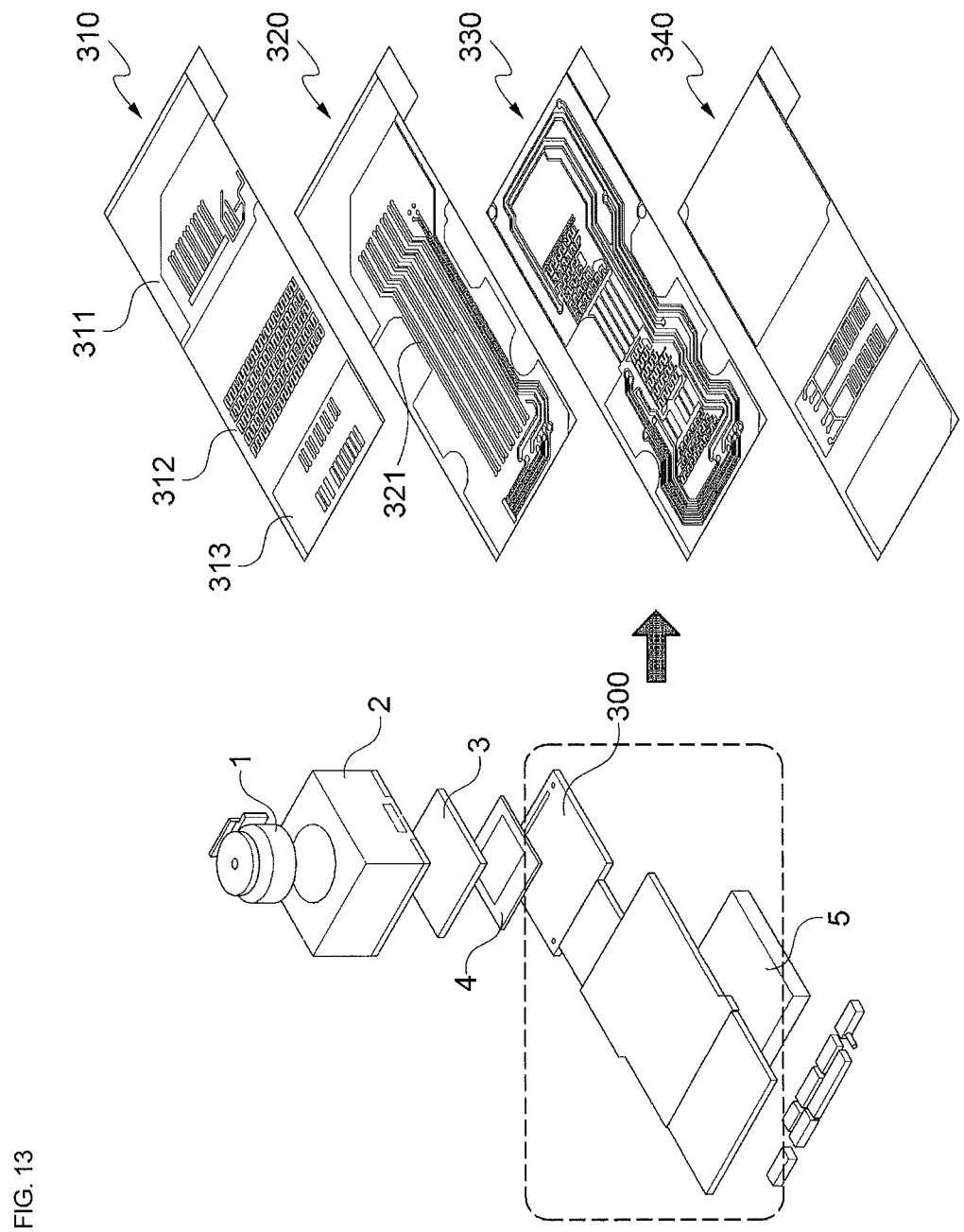
FIG. 13 is an exploded perspective view of a printed circuit board for a camera module according to the second exemplary embodiment of the present disclosure.

FIG. 13 is an exploded perspective view of a printed circuit board 300 for a camera module according to the present exemplary embodiment of the present disclosure.

The printed circuit board 300 for the camera module according to the present exemplary embodiment may be disposed below a lens assembly 1, a VCM assembly 2, an IR filter 3, and a sensor 4, and may also be disposed over an ISP module 5 as shown in FIG. 13.

The printed circuit board 300 according the present exemplary embodiment may include a signal transmitting part 320 and a ground part 330.

The signal transmitting part 320, which is to provide a control signal to the VCM assembly 2, the sensor 4, the ISP module 5, and the like, may include at least one signal line 321.

The signal line 321 according to the present exemplary embodiment, which is to support the MIPI, may be configured by four pairs of lanes and one clock line, but the present invention is not limited thereto and may be configured by only one signal line.

In addition, the ground part 330, which is to provide a ground to the signal line 321 of the signal transmitting part 320, may include first to third conductor patterns 331 through 333.

In this case, the first to third conductor patterns 331 through 333 may configure a first impedance adjusting part by including a conductor pattern having a path longer than the signal line 321.

Figure 14:
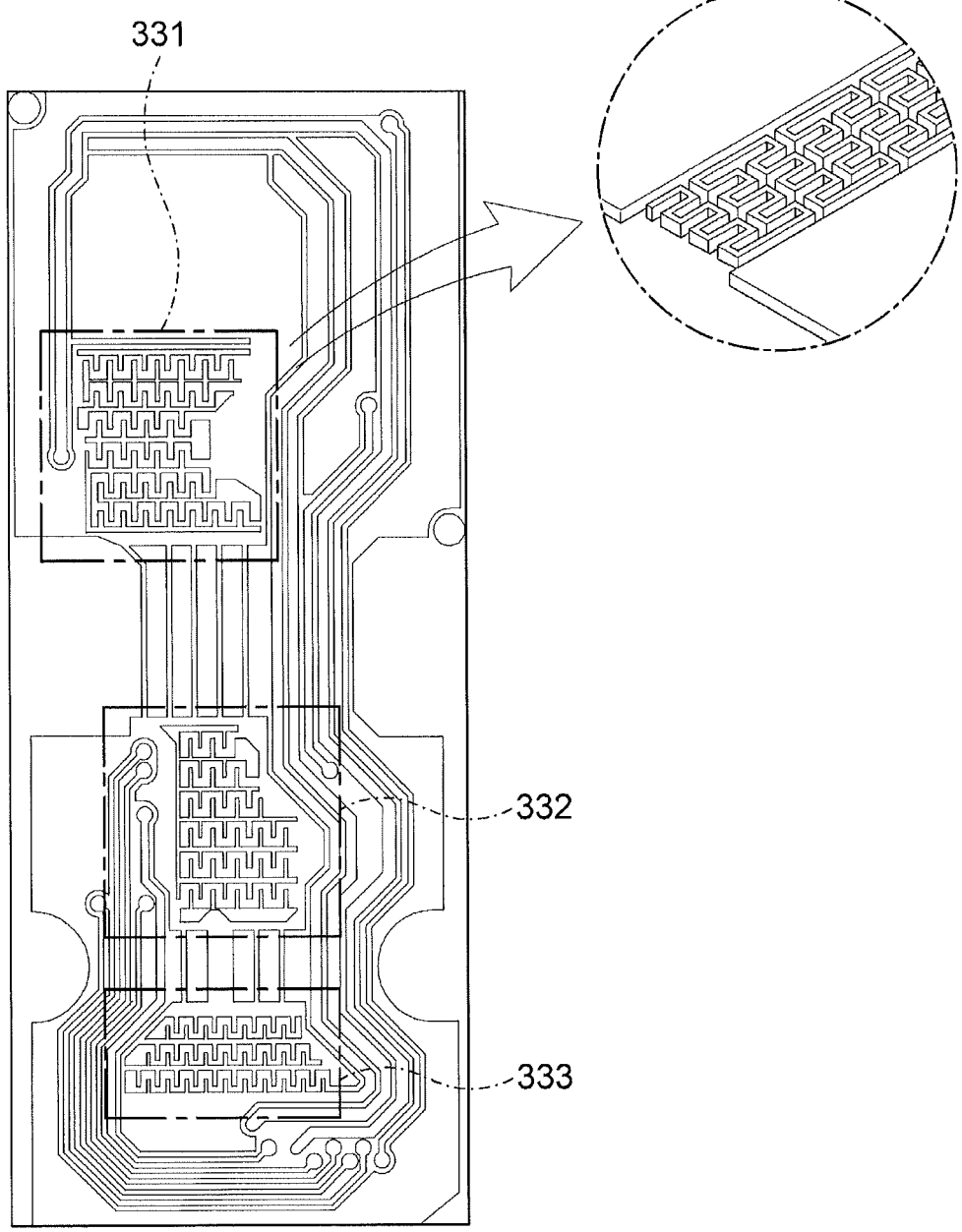
FIG. 14 is a detailed configuration view of the ground part of FIG. 13.

FIG. 14 shows a detailed configuration view of the ground part 330 and particularly shows the first to third conductor patterns 331 through 333 in more detail.

The first conductor pattern 331 of the ground part 330 may be formed on a portion in which the signal line 321 is in contact with the VCM assembly 2, as shown in FIGS. 13 and 14.

In addition, the second conductor pattern 332 of the ground part 330 may be formed below a middle point of the signal line 321, as shown in FIGS. 13 and 14.

In addition, the third conductor pattern 333 of the ground part 330 may be formed on a portion in which the signal line 321 is connected to a control signal line 313 of a sensor mounting part 310 to be described below, as shown in FIGS. 13 and 14.

Since the first to third conductor patterns 331 through 333 included in the ground part 330 as the first impedance adjusting part may have the same configuration and function as the conductor patterns illustrated in FIGS. 2 through 11, a detailed description thereof will be omitted.

In addition, the printed circuit board 300 for the camera module according to the present exemplary embodiment may further include a sensor mounting part 310 for mounting a sensor 4, as shown in FIG. 13.

The sensor mounting part 310 may include a sensor mounting portion 311, a fourth conductor pattern 312, and the control signal line 313 as shown in FIG. 13.

In this case, the fourth conductor pattern 312 may configure a second impedance adjusting part by including a conductor pattern having a path longer than the signal line 321, similar to the first to third conductor patterns 331 through 333 of the ground part 330. In addition, the fourth conductor pattern 312 may allow the impedance to be matched by being disposed over a portion through which the signal line 321 passes.

Meanwhile, since the fourth conductor pattern 312 included in the sensor mounting part 310 as the second impedance adjusting part may have the same configuration and function as the conductor patterns illustrated in FIGS. 2 through 11, a detailed description thereof will be omitted.

In addition, the printed circuit board 300 for the camera module according to the present exemplary embodiment may further include a connector part 340, as shown in FIG. 13.

The connector part 340, which is to provide a connection with the outside, may be rigidly formed.

By the configuration as described above, the printed circuit board 300 for the camera module according to the present exemplary embodiment may match the impedance by the sensor mounting part 310, the signal transmitting part 320, the ground part 330, and the like.

Particularly, the shapes of the ground patterns included in the sensor mounting part 310 and the ground part 330 may be adopted as the shapes illustrated in FIGS. 2 through 9.

Therefore, the printed circuit board 300 for the camera module according to the present exemplary embodiment may adjust lengths of signal feedback paths in the sensor mounting part 310 and the ground part 330 by using the shape of the ground pattern as described above and may adjust impedance accordingly, which will be described below.

Further, since the printed circuit board 300 for the camera module according to the present exemplary embodiment may include the ground patterns having the shapes illustrated in FIGS. 2 through 9 in the sensor mounting part 310 and the ground part 330 as the configuration as shown in FIG. 10B or 11, non-uniformity of conductor ratios between the signal transmitting part 310 and the ground part 330 or between the signal transmitting part 320 and the sensor mounting part 310 as well as non-uniformity of the conductor ratio for each region in the sensor mounting part 310 and the ground part 330 may be improved.

Accordingly, in the printed circuit board 300 for the camera module according to the present exemplary embodiment, since an occurrence of warpage of the printed circuit board caused by the above-mentioned non-uniformity may be significantly decreased, warpage preventing characteristic may also be significantly improved, which will be described below.

Characteristic According to Printed Circuit Board According to the Present Exemplary Embodiment (including Printed Circuit Board for Camera Module)

Impedance Characteristic

Figure 15:
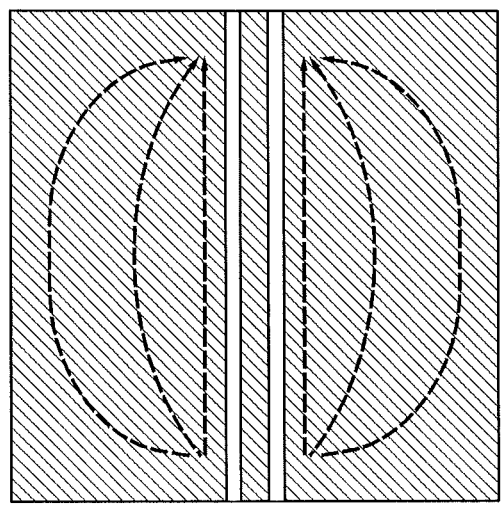
FIG. 15 is a view showing a signal feedback path in a ground part having a general structure.

FIG. 15 is a view showing a signal feedback path in a ground part having a general structure.

Figure 16A:
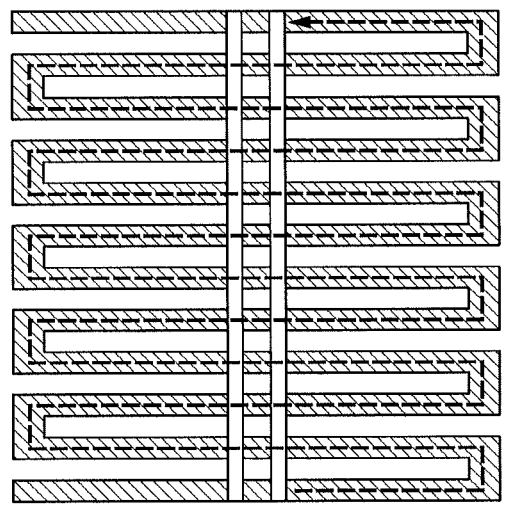
FIG. 16A is a view showing a signal feedback path in a ground part including a conductor pattern of FIG. 2.
Figure 16B:
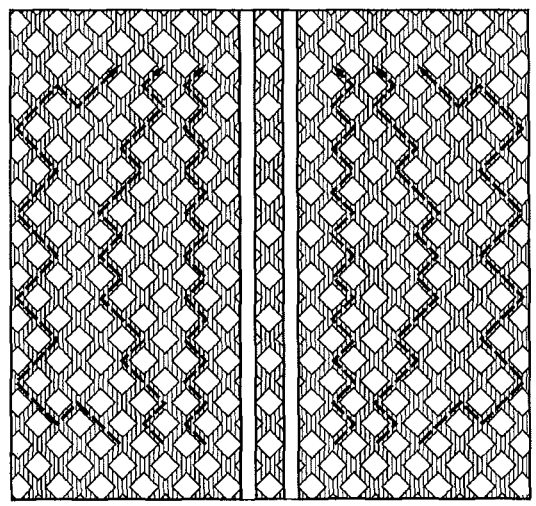
FIG. 16B is a view showing a signal feedback path in a ground part including a conductor pattern of FIG. 9.

In addition, FIGS. 16A and 16B are views showing signal feedback path in ground parts according to the present exemplary embodiment. More particularly, FIG. 16A is a view showing a signal feedback path in a ground part including a conductor pattern of FIG. 2 and FIG. 16B is a view showing a signal feedback path in a ground part including a conductor pattern of FIG. 9.

Referring to FIGS. 15, 16A, and 16B, in the case in which shapes of the conductor patterns included in the ground parts are adopted as the shape according to the present exemplary embodiment, it may be clearly confirmed that a length of the signal feedback path in the ground part may be adjusted.

That is, unlike the general structure (a fill structure having a ratio of the conductor pattern of 100%) shown in FIG. 15, in the case in which the conductor pattern having the shape according to the present exemplary embodiment is included in the ground part, the length of the signal feedback path may be variously adjusted according to the shape of the conductor pattern included in the ground part, as shown in FIGS. 16A and 16B.

Accordingly, according to the present exemplary embodiment, as being clearly confirmed from the views shown in FIGS. 15, 16A and 16B, the length of the signal feedback path in the ground part may be adjusted according to the shape of the conductor pattern (ground pattern) included in the ground part, thereby making it possible to eventually adjust the impedance.

Meanwhile, since impedance characteristic is influenced by the height (i.e., h in the first exemplary embodiment and h1 and h2 in the second exemplary embodiment) between the signal line and the ground pattern, if the height becomes low, the impedance characteristic cannot help being degraded, which may act as a very large obstacle in the impedance matching.

However, according to the present exemplary embodiment, although the height gradually becomes low on the ground of a recent technical trend such as miniaturization, thinness, or the like, the degraded impedance characteristic may be increased by including the conductor pattern having the shape according to the present exemplary embodiment in the ground part, which may also be clearly confirmed from the FIGS. 17A, 17B, and 18 to be described below.

Figure 17A:
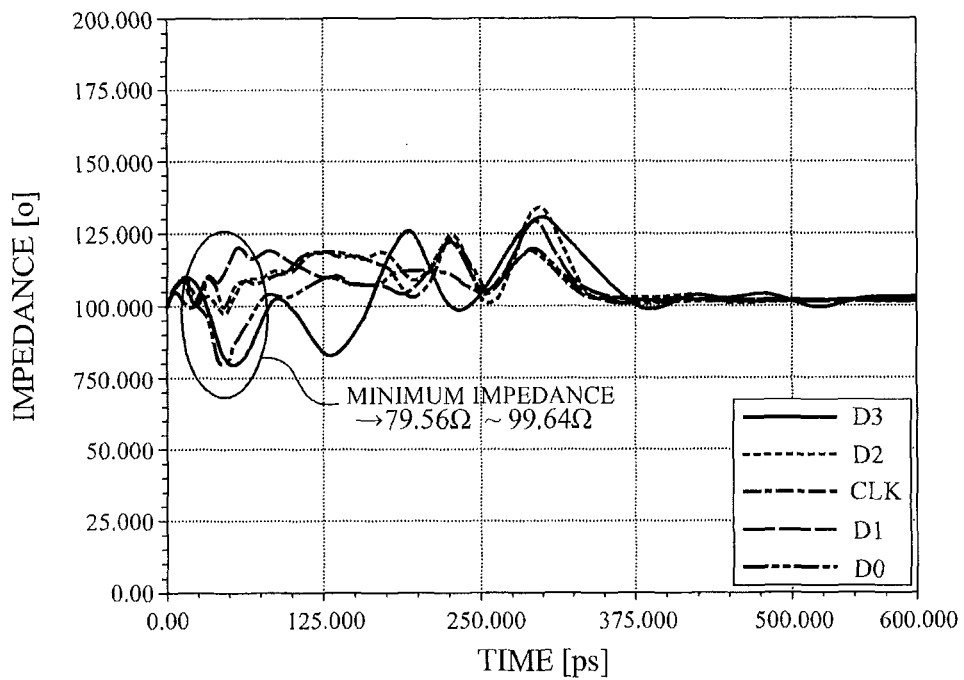
FIG. 17A is a view showing results obtained by simulating impedance characteristic according to a printed circuit board having a general structure over time.
Figure 17B:
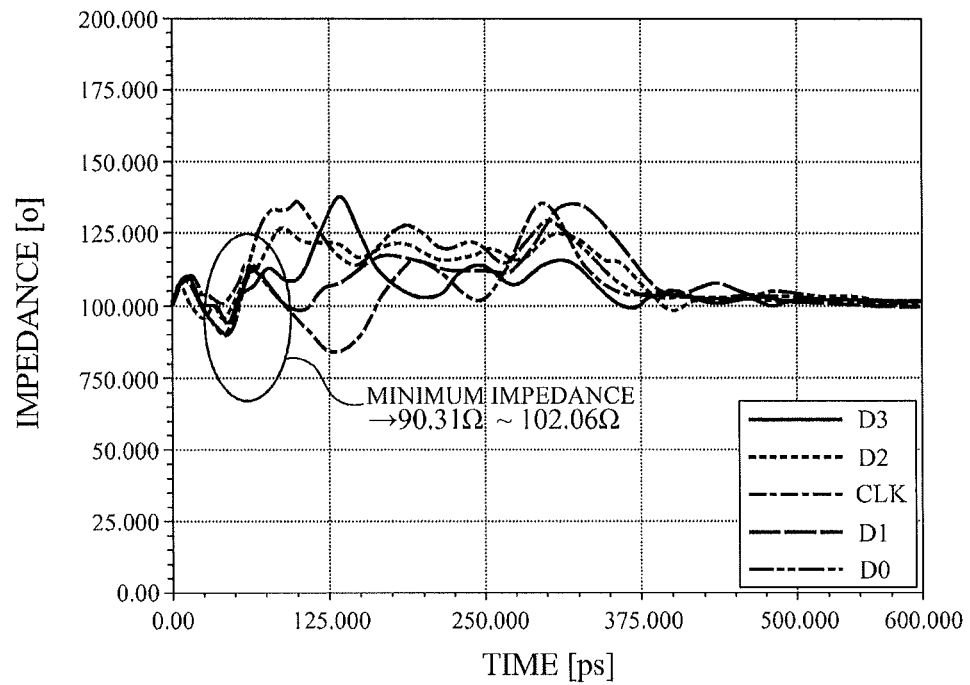
FIG. 17B is a view showing results obtained by simulating impedance characteristic according to a printed circuit board of the present exemplary embodiment over time.

FIGS. 17A and 17B are views showing results obtained by simulating impedance characteristic (FIG. 17A) according to a printed circuit board having a general structure and impedance characteristic (FIG. 17B) according to a printed circuit board of the present exemplary embodiment over time.

Figure 18:
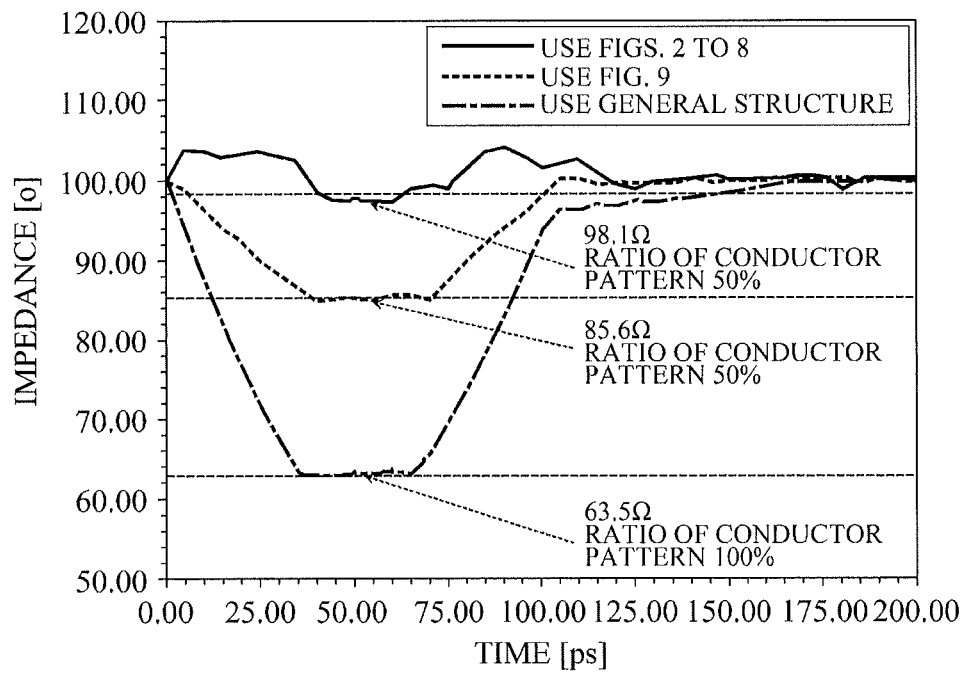
FIG. 18 is a view showing results obtained by simulating, over time, impedance characteristic of the printed circuit board using the ground part having the general structure, impedance characteristic of the printed circuit board including the conductors patterns illustrated in FIGS. 2 through 8 in the ground part, and impedance characteristic of the printed circuit board including the conductor pattern illustrated in FIG. 9 in the ground part.

In addition, FIG. 18 is a view showing results obtained by simulating, over time, impedance characteristic of the printed circuit board using the ground part having the general structure, impedance characteristic of the printed circuit board including the conductor patterns illustrated in FIGS. 2 through 8 in the ground part, and impedance characteristic of the printed circuit board including the conductor pattern illustrated in FIG. 9 in the ground part.

Referring to FIGS. 17A, 17B, and 18, in the case in which the shapes of the conductor patterns included in the ground parts are adopted as the shape according to the present exemplary embodiment, it may be clearly confirmed that the impedance characteristic may be increased.

That is, according to the simulation results of FIGS. 17A and 17B, it may be confirmed that a minimum impedance of FIG. 17B is much higher than a minimum impedance of FIG. 17A in the impedance characteristic over time of various signal lines D0 to D4 and CLK in the printed circuit board.

In addition, according to the simulation results of FIG. 18, it may be confirmed that the case in which the conductor pattern having the shape according to the present exemplary embodiment is included in the ground part may implement impedance which is increased by about 26% to 35% as compared to the printed circuit board using the ground part having the general structure.

As a result, according to the present exemplary embodiment, as being clearly confirmed from the simulation results of FIGS. 17A, 17B, and 18, since the impedance characteristic which cannot help being degraded according to the recent technical trend may be increased and the impedance matching may be easily performed accordingly, problems (damage to the IC, energy loss, and the like) caused by the impedance matching which is not properly performed may be easily solved.

Meanwhile, referring to FIG. 18, it may be confirmed that the impedances formed by the conductor patterns illustrated in FIGS. 2 through 8 is larger than the impedance formed by the conductor pattern illustrated in FIG. 9 in the case in which the conductor patterns (i.e., the conductor patterns the plurality unit patterns having the open curve shape) illustrated in FIGS. 2 through 8 and the conductor pattern (i.e., the conductor pattern including the plurality of unit patterns having the closed curve shape) illustrated in FIG. 9 have the same ratio as the conductor pattern in the ground part.

That is, according to the simulation result of FIG. 18, in the case in which the conductor patterns illustrated in FIGS. 2 through 8 and the conductor pattern illustrate in FIG. 9 have the same ratio as the conductor pattern in the ground part (in the present exemplary embodiment, having the same ratio of 50%), it may be confirmed that the case in which the conductor patterns illustrate in FIGS. 2 through 8 are included in the ground part may implement the impedance characteristic larger than that of the case in which the conductor pattern illustrated in FIG. 9 is included in the ground part.

Accordingly, if the ratios of the conductor pattern in the ground part are equal to each other, the case in which the conductor patterns (the conductor patterns illustrated in FIGS. 2 through 8) including the plurality of unit patterns having the open curve shape are included in the ground part may be advantageous with respect to the impedance characteristic than the case in which the conductor pattern (the conductor pattern illustrated in FIG. 9) including the plurality of unit patterns having the closed curve shape is included in the ground part.

Warpage Preventing Characteristic

Figure 19:
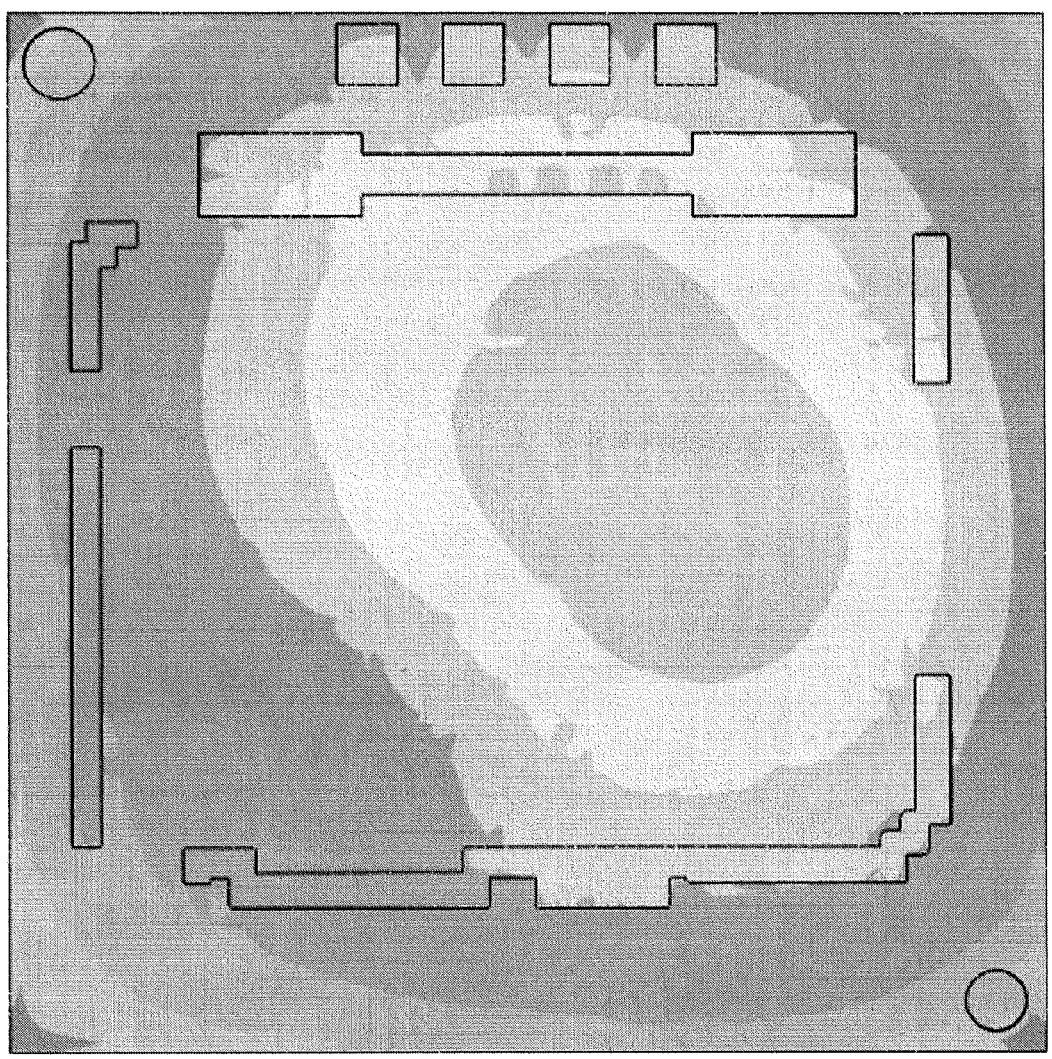
FIG. 19 is a view showing a simulation result for warpage preventing characteristic of the printed circuit board having the general structure.
Figure 20:
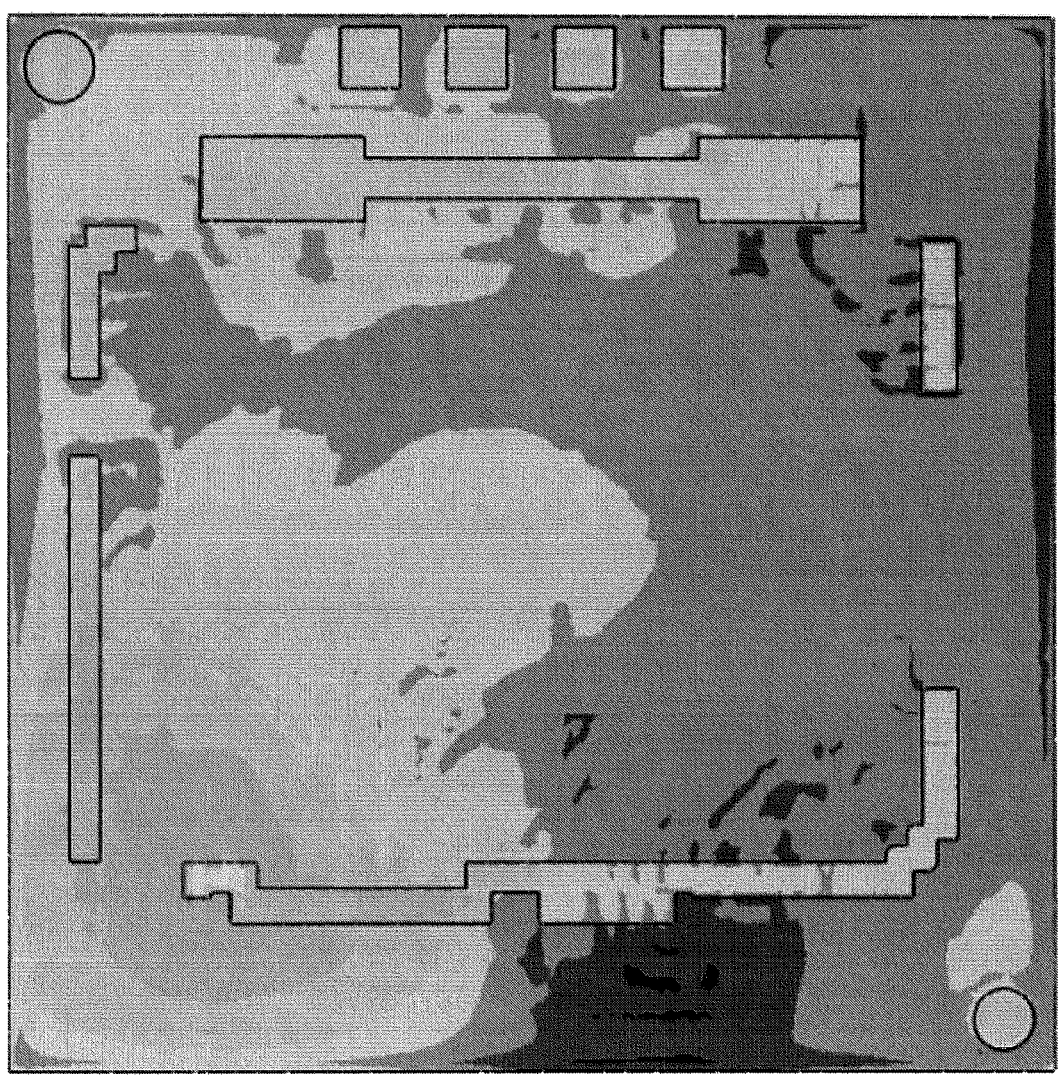
FIG. 20 is a view showing a simulation result for warpage preventing characteristic of the printed circuit board using the ground part of FIG. 10B.
Figure 21:
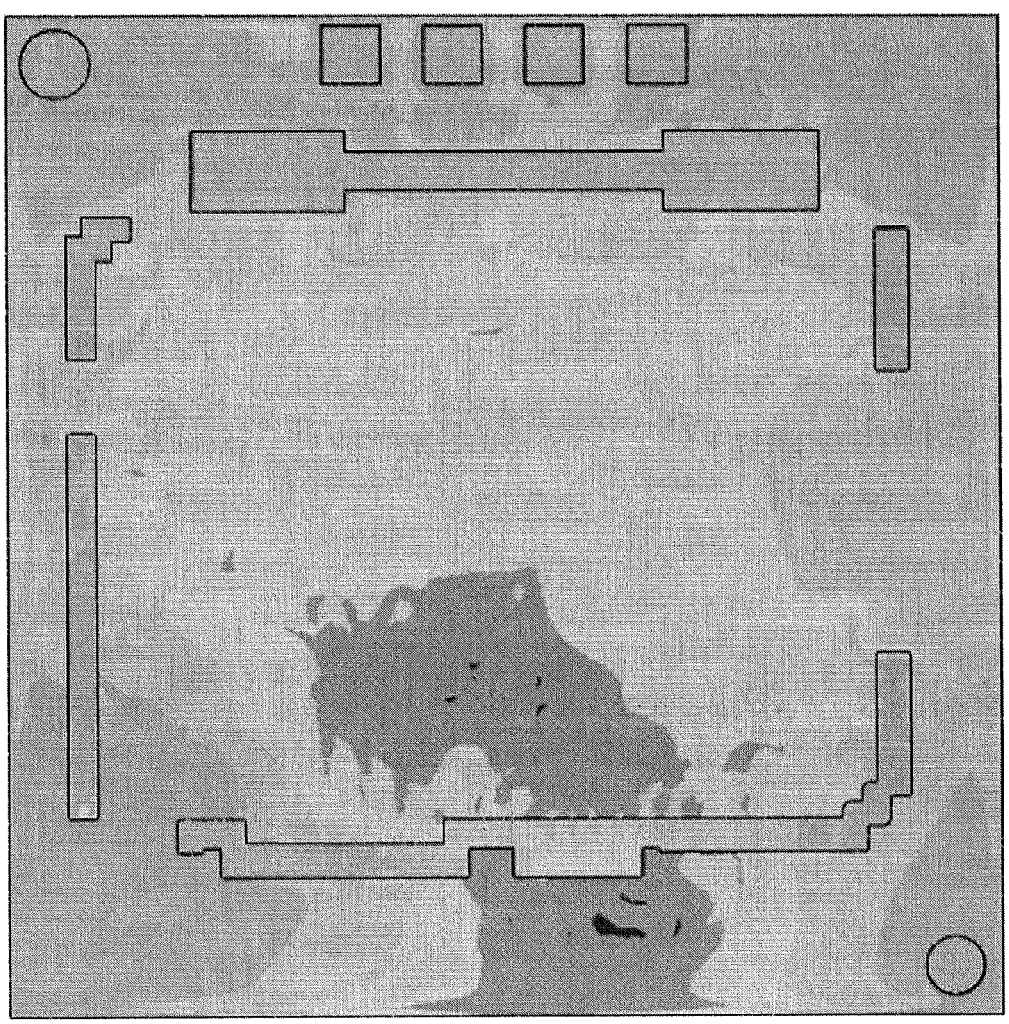
FIG. 21 is a view showing a simulation result for warpage preventing characteristic of the printed circuit board using the ground part of FIG. 11.

FIG. 19 is a view showing a simulation result for warpage preventing characteristic of the printed circuit board having the general structure. In addition, FIGS. 20 and 21 are views showing simulation results for warpage preventing characteristic of the printed circuit board according to the present exemplary embodiment. More particularly, FIG. 20 is a view showing a simulation result for warpage preventing characteristic of the printed circuit board using the ground part of FIG. 10B and FIG. 21 is a view showing a simulation result for warpage preventing characteristic of the printed circuit board using the ground part of FIG. 11.

In this case, the simulation results of FIGS. 19 to 21 exhibit red, yellow, blue, green, and the like, where the more red, the more easy state warpage occurs, and the more green, the more difficult state warpage occurs. Accordingly, if a red region and yellow region exhibit in the simulation result, it represent that portions having vulnerable warpage preventing characteristic occur.

First, referring to FIG. 19, in case of the printed circuit board having the general structure, it may be confirmed that the red and yellow regions relatively widely occupy across a center portion and a right upper end. Therefore, it may be confirmed that warpage having a high value has occurred.

On the contrary, in case of the printed circuit board of FIG. 20, since non-uniformity of the conductor ratio between the signal transmitting part and the ground part may be improved as described above, it may be confirmed that the warpage preventing characteristic may be improved as compared to the printed circuit board of FIG. 19, as shown in FIG. 20.

That is, according to the simulation result of FIG. 20, it may be confirmed that only blue and green regions exhibit but the red and yellow regions does not exhibit, warpage having a value which is significantly lower than the printed circuit board of FIG. 19 has occurred, and the like. Thereby, it may be clearly confirmed that the printed circuit board of FIG. 20 may significantly improve as compared to the printed circuit board of FIG. 19.

Meanwhile, referring to FIG. 21, as mentioned above, since non-uniformity of the conductor ratio between the signal transmitting part and the ground part as well as non-uniformity of the conductor ratio for each region in the ground part may be improved, it may be confirmed that the warpage preventing characteristic may be improved as compared to the printed circuit board of FIG. 19 and the warpage preventing characteristic may also be improved as compared to the printed circuit board of FIG. 20, as shown in FIG. 21.

That is, according to the simulation result of FIG. 21, it may be confirmed that only blue and green regions exhibit but the red and yellow regions does not exhibit, warpage having a value which is significantly lower than the printed circuit board of FIG. 19 has occurred, the green region is much more widened than the printed circuit board of FIG. 20, warpage having a value which is lower than the printed circuit board of FIG. 20 has occurred, and the like. Thereby, it may be clearly confirmed that the printed circuit board of FIG. 21 may significantly improve as compared to the printed circuit board of FIG. 19 and may also improve as compared to the printed circuit board of FIG. 20.

According to the exemplary embodiment of the present invention, the impedance may be adjusted by using the shape of the ground pattern which is implemented on the board.

In addition, according to the exemplary embodiment of the present invention, the impedance may be adjusted and the warpage may be prevented by minimizing the ratio deviation of the ground pattern which is implemented on the board in the relationship with the signal pattern or the relationship with the adjacent ground pattern.

In the present specification, 'an exemplary embodiment' and other modified expressions mean that a certain feature, structure, or characteristic is included in at least one embodiment. Accordingly, the expression "an exemplary embodiment" and other modified examples in the present specification may not denote the same embodiment.

In the present specification, the expression "at least one of A and B" is used to include a selection of only A, only B, or both A and B. Furthermore, the expression "at least one of A through C" may be used to include a section of only A, only B, only C, only A and B, only B and C, or all of A through C. One of ordinary skill in the art would be able to clearly interpret a similar expression with more elements.

Hereinabove, the present invention has been described with reference to exemplary embodiments thereof. All exemplary embodiment and conditional illustrations in the present specification have been described to intend to assist in understanding of a principle and concept of the present invention by those of ordinary sill in the art. Therefore, it will be understood by those of ordinary skill in the art that various changes in form and details may be made therein without departing from the spirit and scope of the inventive concept as defined by the appended claims. Therefore, the exemplary embodiments should be considered in a descriptive sense only and not for purposes of limitation. The scope of the inventive concept is defined not by the detailed description but by the appended claims, and all differences within the scope will be construed as being included in the present inventive concept.

What is claimed is:
1. A printed circuit board comprising:
a signal transmitting part;
a ground part that includes an impedance adjusting part in the same layer as the ground part; and
an insulating layer between the signal transmitting part and the ground part,
wherein the signal transmitting part includes at least one signal line,
wherein the impedance adjusting part includes a conductor pattern, and
wherein the conductor pattern is formed so that a ratio deviation of the conductor pattern for each corresponding region in corresponding regions of the signal transmitting part and the ground part is minimized.
2. The printed circuit board according to claim 1, wherein the
conductor pattern has a path longer than the signal line.

3. The printed circuit board according to claim 1, wherein the conductor pattern includes a plurality of unit patterns having an open curve shape.

4. The printed circuit board according to claim 1, wherein the conductor pattern is formed so that a ratio deviation of the conductor pattern for each region in the ground part is minimized.

5. The printed circuit board according to claim 3, wherein the unit pattern having the open curve shape includes at least one sub-unit pattern.

6. The printed circuit board according to claim 5, wherein the conductor pattern is formed so that a ratio deviation of the conductor pattern for each region in the ground part is minimized.

7. The printed circuit board according to claim 5, wherein the sub-unit pattern has the open curve shape.

8. The printed circuit board according to claim 7, wherein the conductor pattern is formed so that a ratio deviation of the conductor pattern for each region in the ground part is minimized.

9. The printed circuit board according to claim 5, wherein the sub-unit pattern has a closed curve shape.

10. The printed circuit board according to claim 9, wherein the conductor pattern is formed so that a ratio deviation of the conductor pattern for each region in the ground part is minimized.

11. The printed circuit board according to claim 3, wherein at least one unit pattern having a closed curve shape is included between the unit patterns having the open curve shape.

12. The printed circuit board according to claim 11, wherein the conductor pattern is formed so that a ratio deviation of the conductor pattern for each region in the ground part is minimized.

13. The printed circuit board according to claim 3, wherein the conductor pattern forms one path by connecting the plurality of unit patterns to one other.

14. The printed circuit board according to claim 13, wherein when the conductor pattern including the plurality of unit patterns having the open curve shape and the conductor pattern including a plurality of unit patterns having a closed curve shape have the same ratio as the conductor pattern in the ground part, impedance formed by the conductor pattern including the plurality of unit patterns having the open curve shape is larger than impedance formed by the conductor pattern including the plurality of unit patterns having the closed curve shape.

15. A printed circuit board for a camera module, comprising:
a signal transmitting part configured to transmit a control signal;
a ground part providing a ground to the signal transmitting part; and
an impedance adjusting part formed as part of the ground part,
wherein the signal transmitting part includes at least one signal line,
wherein the first impedance adjusting part includes a conductor pattern, and
wherein the conductor pattern is formed so that a ratio deviation of the conductor pattern for each corresponding region in corresponding regions of the signal transmitting part and the ground part is minimized.

16. The printed circuit board for the camera module according to claim 15, wherein the
conductor pattern has a path longer than the signal line.

17. The printed circuit board for the camera module according to claim 15, wherein the conductor pattern includes a plurality of unit patterns having an open curve shape.

18. The printed circuit board for the camera module according to claim 15, wherein the conductor pattern is formed so that a ratio deviation of the conductor pattern for each region in the ground part is minimized.

19. The printed circuit board for the camera module according to claim 17, where the conductor pattern forms one path by connecting the plurality of unit patterns to one other.

20. The printed circuit board for the camera module according to claim 19, wherein when the conductor pattern including the plurality of unit patterns having the open curve shape and the conductor pattern including a plurality of unit patterns having a closed curve shape have the same ratio as the conductor pattern in the ground part, impedance formed by the conductor pattern including the plurality of unit patterns having the open curve shape is larger than impedance formed by the conductor pattern including the plurality of unit patterns having the closed curve shape.

21. A printed circuit board comprising:
a signal line;
a conductive ground part that is discontinuous along a line parallel to the signal line; and
an insulating layer between the signal line and the ground part
wherein the ground part is a layer comprised of rows of conductive patterns that extend from a position on one side of the signal line to a position on another side of the signal line, and
wherein the rows are connected to each other to form a conductive path.

22. The printed circuit board according to claim 21, wherein the rows of conductive patterns are separated from each other by a gap.

23. The printed circuit board according to claim 21,
wherein the signal line is between the ground part and a second conductive ground part that is discontinuous along a line parallel to the signal line, and
the second conductive ground part is separated from the signal line by a second insulating layer.

24. The printed circuit board according to claim 1, wherein the conductor pattern forms one path by connecting the plurality of unit patterns to one other.

25. The printed circuit board according to claim 4, wherein the conductor pattern forms one path by connecting the plurality of unit patterns to one other.

26. The printed circuit board according to claim 24, wherein when the conductor pattern including the plurality of unit patterns having the open curve shape and the conductor pattern including a plurality of unit patterns having a closed curve shape have the same ratio as the conductor pattern in the ground part, impedance formed by the conductor pattern including the plurality of unit patterns having the open curve shape is larger than impedance formed by the conductor pattern including the plurality of unit patterns having the closed curve shape.

27. The printed circuit board according to claim 25, wherein when the conductor pattern including the plurality of unit patterns having the open curve shape and the conductor pattern including a plurality of unit patterns having a closed curve shape have the same ratio as the conductor pattern in the ground part, impedance formed by the conductor pattern including the plurality of unit patterns having the open curve shape is larger than impedance formed by the conductor pattern including the plurality of unit patterns having the closed curve shape.

28. The printed circuit board for the camera module according to claim 15, where the conductor pattern forms one path by connecting the plurality of unit patterns to one other.

29. The printed circuit board for the camera module according to claim 18, where the conductor pattern forms one path by connecting the plurality of unit patterns to one other.

30. The printed circuit board for the camera module according to claim 28, wherein when the conductor pattern including the plurality of unit patterns having the open curve shape and the conductor pattern including a plurality of unit patterns having a closed curve shape have the same ratio as the conductor pattern in the ground part, impedance formed by the conductor pattern including the plurality of unit patterns having the open curve shape is larger than impedance formed by the conductor pattern including the plurality of unit patterns having the closed curve shape.

31. The printed circuit board for the camera module according to claim 29, wherein when the conductor pattern including the plurality of unit patterns having the open curve shape and the conductor pattern including a plurality of unit patterns having a closed curve shape have the same ratio as the conductor pattern in the ground part, impedance formed by the conductor pattern including the plurality of unit patterns having the open curve shape is larger than impedance formed by the conductor pattern including the plurality of unit patterns having the closed curve shape.

* * * * *